(12) United States Patent
Uchibori

(10) Patent No.: US 10,027,579 B2
(45) Date of Patent: Jul. 17, 2018

(54) INTEGRATED CIRCUIT, SEMICONDUCTOR DEVICE, CARD AND DATA TRANSFER METHOD

(71) Applicant: NEC Corporation, Minato-ku, Tokyo (JP)

(72) Inventor: Shusaku Uchibori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 100 days.

(21) Appl. No.: 15/079,300

(22) Filed: Mar. 24, 2016

(65) Prior Publication Data

US 2016/0285758 A1 Sep. 29, 2016

(30) Foreign Application Priority Data

Mar. 27, 2015 (JP) ................. 2015-066619

(51) Int. Cl.
*H04L 12/28* (2006.01)
*H04L 12/775* (2013.01)
*G06F 17/50* (2006.01)
*G06F 11/00* (2006.01)

(52) U.S. Cl.
CPC .............. *H04L 45/58* (2013.01); *G06F 11/00* (2013.01); *G06F 17/50* (2013.01)

(58) Field of Classification Search
None
See application file for complete search history.

(56) References Cited

U.S. PATENT DOCUMENTS

| | | | | |
|---|---|---|---|---|
| 2014/0177473 A1* | 6/2014 | Kumar | .................... | H04L 45/04 370/255 |
| 2014/0328208 A1* | 11/2014 | Norige | .................... | H04L 45/06 370/254 |
| 2015/0043575 A1 | 2/2015 | Kumar et al. | | |
| 2015/0256448 A1* | 9/2015 | Xiao | ....................... | H04L 45/26 370/235 |
| 2015/0288596 A1* | 10/2015 | Kumar | .................. | H04L 45/121 370/254 |
| 2016/0182256 A1* | 6/2016 | Anders | ............... | G06F 15/7825 370/352 |
| 2016/0182405 A1* | 6/2016 | Chen | ..................... | H04L 49/109 370/353 |
| 2016/0205042 A1* | 7/2016 | Seo | ......................... | H04L 45/16 370/392 |
| 2016/0344629 A1* | 11/2016 | Gray | ........................ | H04L 45/60 |
| 2017/0060151 A1* | 3/2017 | Vaisband | ................. | G05F 1/46 |
| 2017/0063610 A1* | 3/2017 | Kumar | ............... | H04L 41/0803 |
| 2017/0161214 A1* | 6/2017 | Dobbs | ................ | G06F 13/1652 |
| 2017/0171115 A1* | 6/2017 | Kumar | ............... | H04L 49/9005 |

FOREIGN PATENT DOCUMENTS

| | | |
|---|---|---|
| JP | 2009-110512 A | 5/2009 |
| JP | 2011-182393 A | 9/2011 |
| JP | 5488589 B2 | 5/2014 |
| WO | 2011/148925 A1 | 12/2011 |

OTHER PUBLICATIONS

Japanese Office Action for JP Application No. 2015-066619 dated Feb. 2, 2016 with English Translation.

* cited by examiner

*Primary Examiner* — Otis L Thompson, Jr.

(57) ABSTRACT

An integrated circuit includes a plurality of modules including a plurality of routers, each of the module sending and receiving data with another module through a plurality of first routers included in the module and a plurality of second routers included in another module.

11 Claims, 26 Drawing Sheets

INTEGRATED CIRCUIT, SEMICONDUCTOR DEVICE, CARD AND DATA TRANSFER METHOD

This application is based upon and claims the benefit of priority from Japanese Patent Application No. 2015-066619, filed on Mar. 27, 2015, the disclosure of which is incorporated herein in its entirety by reference.

TECHNICAL FIELD

The present invention relates to an integrated circuit using network on chip architecture, a semiconductor device mounting the integrated circuit, a card and a data transfer method.

BACKGROUND ART

For example, Japanese Patent Application Laid-open Publication No. 2009-110512 (hereinafter referred to as 'PTL1') discloses one example of network on chip architecture. The network on chip which is described in PTL1 includes integration processor blocks, a router, memory communication controllers and a network interface controller. In the network on chip described in PTL1, firstly, each of the integration processor blocks is coupled with the router through the memory communication controller and the network interface controller. Secondly, each of the memory communication controllers controls communication between the integration processor block and a memory. Thirdly, each of the network interface controllers controls communication between the integration processor blocks through the router.

Japanese Patent Application Laid-open Publication No. 2011-182393 (hereinafter referred to as 'PTL2') discloses an example of a chip using network on chip architecture. The chip which is described in PTL 2 includes function modules. Each of the function modules includes a single processing unit and a single routing unit connected to one another. Furthermore, connections called routing connection, each of which has at least one end connected to the routing unit of the function module, where the routing connections connect between themselves the routing units of the functional modules so as to allow a routing of data between the processing units of the functional modules. In the chip, firstly, the routing unit of at least one function modules, which are called split routing unit, includes two routers called a first-level router and a second-level router respectively. The first-level router and the second-level router are connected with each other. The first-level router is moreover connected to at least two routing connections. The second level router is moreover connected to the processing unit of the function module, and is also connected to at least another routing connection.

SUMMARY

An object of the present invention is to provide an integrated circuit, a semiconductor device, a card and a data transfer method which, in a semiconductor chip applying network on chip architecture which more preferably reduce an area occupied by a router under the condition of assuring a predetermined data transfer throughput.

An integrated circuit according to one aspect of the present invention includes a plurality of modules each including a plurality of routers, each module of the plurality of module sending and receiving data with another module thereof via a plurality of first routers included in own module and a plurality of second routers included in another module, each of the plurality of first routers corresponding to each of the plurality of second routers.

A semiconductor device according to one aspect of the present invention includes the integrated circuit, a package that encapsulates the integrated circuit and a connection terminal configured to connect to the integrated circuit and to extend outside of the package.

A card according to one aspect of the present invention includes the integrated circuit and a circuit configured to supply electric power to the integrated circuit.

A data transfer method for a plurality of modules each including a plurality of routers included in a semiconductor circuit in an aspect of the present invention including each module of the plurality of module sending and receiving data with another module thereof via a plurality of first routers included in own module and a plurality of second routers included in another module, each of the plurality of first routers corresponding to each of the plurality of second routers.

BRIEF DESCRIPTION OF THE DRAWINGS

Exemplary features and advantages of the present invention will become apparent from the following detailed description when taken with the accompanying drawings in which.

EXEMPLARY EMBODIMENT

Next, exemplary embodiments of the present invention will be explained in detail with reference to drawings. In respective drawings and respective exemplary embodiments described in the description, the same components are provided with the same reference signs and descriptions thereof will be omitted appropriately. Moreover, in respective drawings, only representative components are provided with reference signs, and reference signs of other components are arbitrarily omitted.

<<<First Exemplary Embodiment>>>

Figure 1:
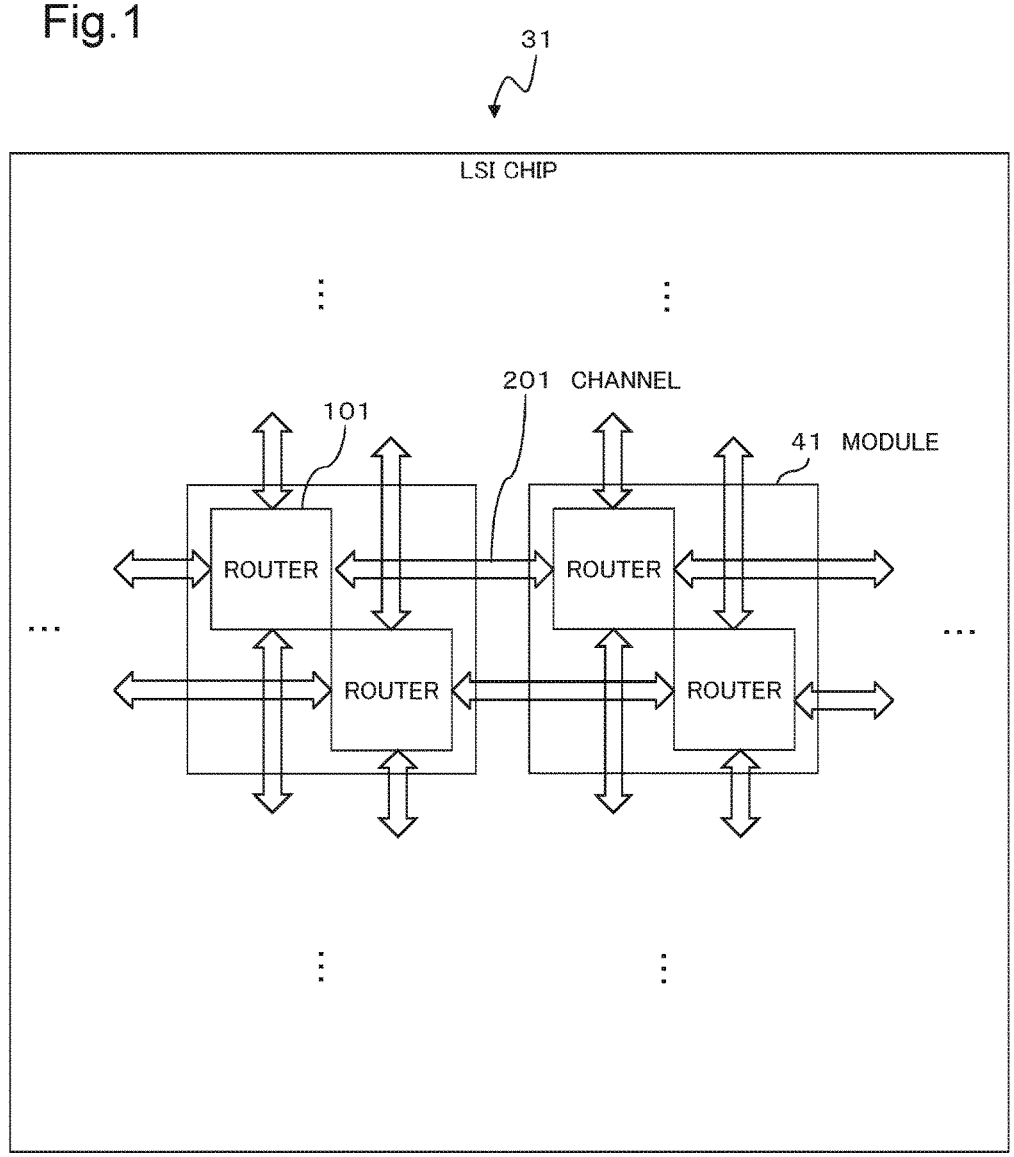
FIG. 1 is a block diagram illustrating a basic configuration of a LSI chip according to a first exemplary embodiment of the resent invention.

FIG. 1 is a block diagram illustrating a basic configuration of a LSI chip (also referred to as a semiconductor chip) 31 according to a first exemplary embodiment of the present invention.

As illustrated in FIG. 1, the LSI chip 31 according to the present exemplary embodiment includes a plurality of modules 41 and a plurality of routers 101 which are included in each of the modules 41. Notwithstanding the explanation illustrated in FIG. 1, arbitrary number of the modules 41 and the routers 101 may be included in the LSI chip 31.

A module 41 sends data to another module 41 through the plural routers 101 which the module 41 includes, and receives data from the other module 41. Each of plural routers 101 which are included in the module 41 (referred to as first plural routers 101) sends and receives data with plural routers 101 which are included in another module 41 (referred to as second plural router). Here, each of the first plural routers 101 has an one to one correspondence with each of the second plural routers 101.

The first router 101 and the second router 101 are connected each other through a channel 201.

Figure 2:
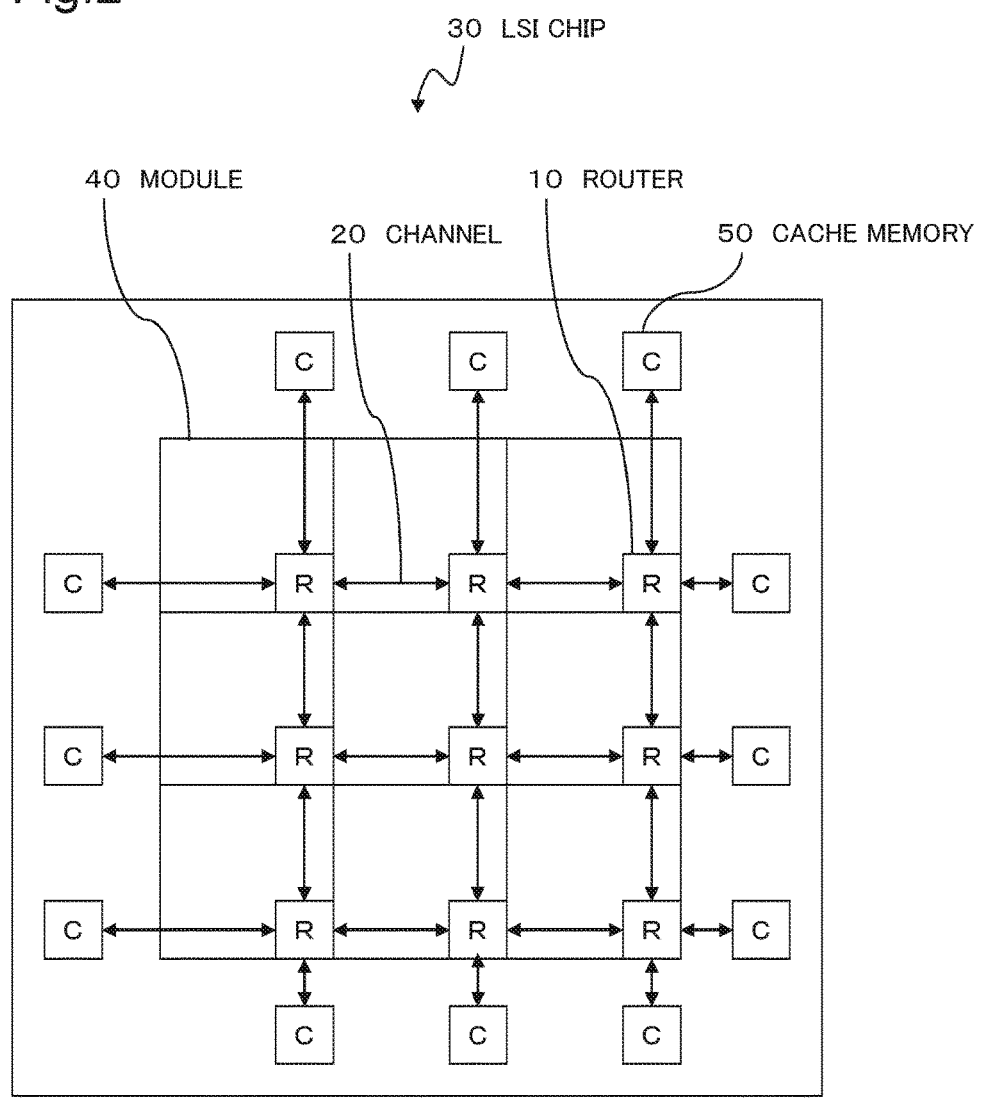
FIG. 2 is a block diagram illustrating a configuration of a LSI chip in a related art.

In order to compare with the present exemplary embodiment, a LSI chip 30 according to a related art, to which the technical feature disclosed in this exemplary embodiment is not applied, will be explained in the following. The LSI chip 30 includes a module 40 having one router 10 as illustrated in FIG. 2 FIG. 2 is a block diagram illustrating a configuration of the LSI chip 30 using network on chip technology. The LSI chip 30 includes a plurality of modules 40 and a plurality of cache memories 50. In FIG. 2 and figures described later, 'R' and 'C' express a router and a cache memory respectively.

Each module 40 includes one router 10 and a core (not illustrated in the drawing). Each router 10 is connected to the router 10 of adjacent module 40 through a channel 20. The channel 20 includes a plurality of wires. The number of the wires determines a size of data which are sent through the channel 20 at one time. Communication between the modules 40 is executed through the router 10 and the channel 20. The core of the each module 40 carries out data processing in the module 40 such as calculation processing.

The cache memory 50 is a memory for storing data read from an external memory (not illustrated in the drawing: for example, main memory unit), or which are stored in the external memory.

Figure 3:
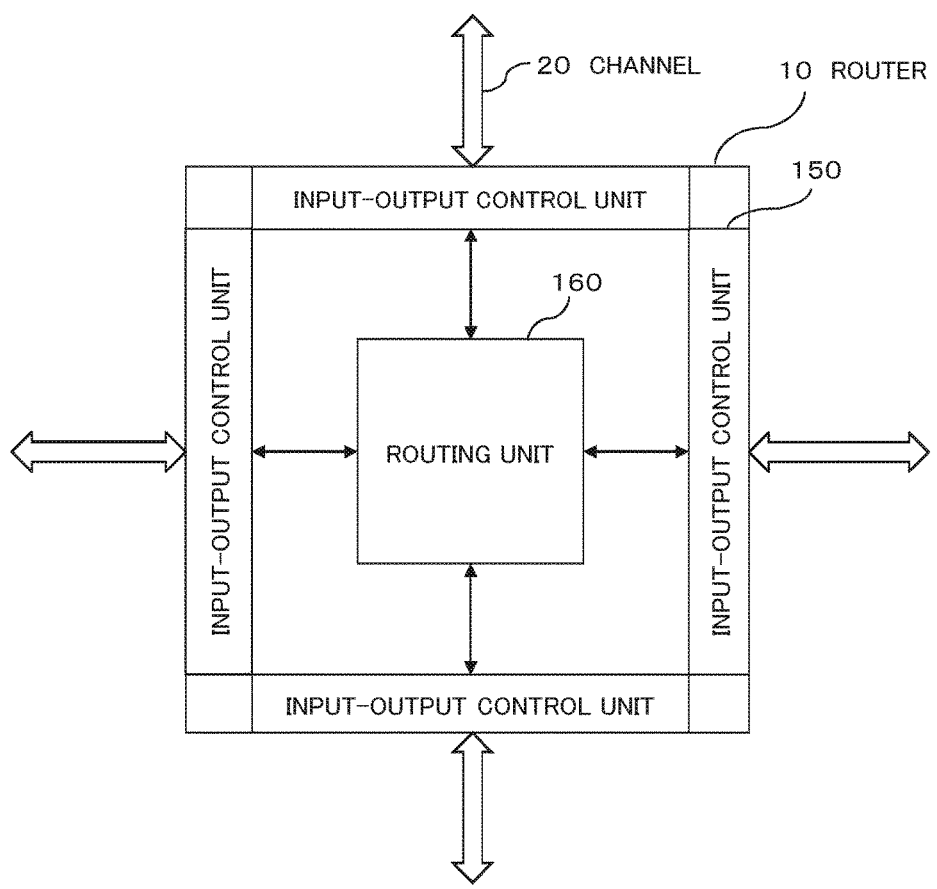
FIG. 3 is a block diagram illustrating a configuration of a router in the related art.

FIG. 3 is a block diagram illustrating a configuration of the router 10. The router 10 includes an input-output control unit 150 and a routing unit 160.

Figure 4:
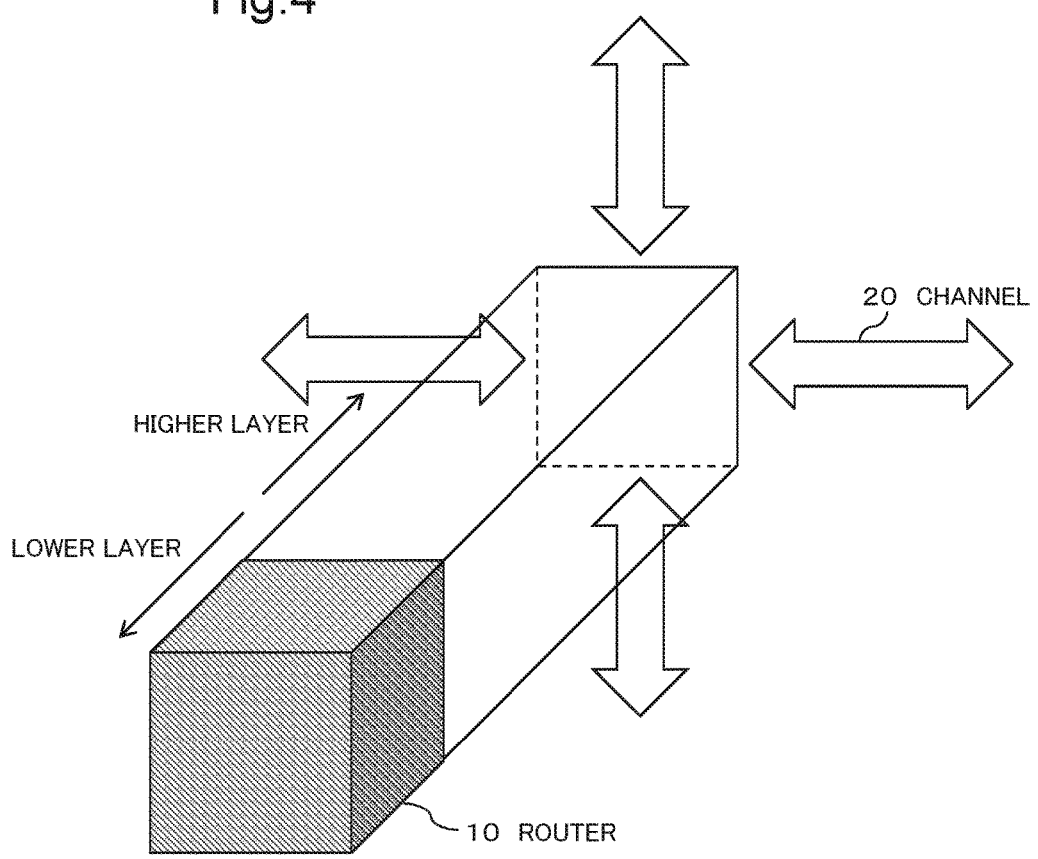
FIG. 4 is a perspective view of a router portion in the related art.

The input-output control unit 150 is connected to the channel 20. The input-output control unit 150 includes a buffer which is mainly composed of registers, and occupies most of the hardware volume of the router 10. Since a buffer size is proportional to the number of the wires used as the channel 20, the hardware volume of the router 10 is proportional to the number of the physical wires which are included in the channel 20. Each of the input-output control units 150 is connected to the routing unit 160. An area occupied by the router 10 is proportional to the square of the number of physical wires of the channel 20. The area occupied by the router 10 will be explained using FIG. 4. FIG. 4 is a perspective view of the router 10 part of the module 40, by viewing the router 10 of the module 40 illustrated in FIG. 2 from a bottom surface side of the module 40. A lower layer side block indicated by a slant line in FIG. 4 is an area occupied by a logic circuit of the router 10. The physical wires of the channels 20 are connected to each side of the router 10. Accordingly, a length of each side of the router 10 is proportional to the number of the physical wires, and the area occupied by the router 10 is proportional to the square of the number of the physical wires.

Figure 5:
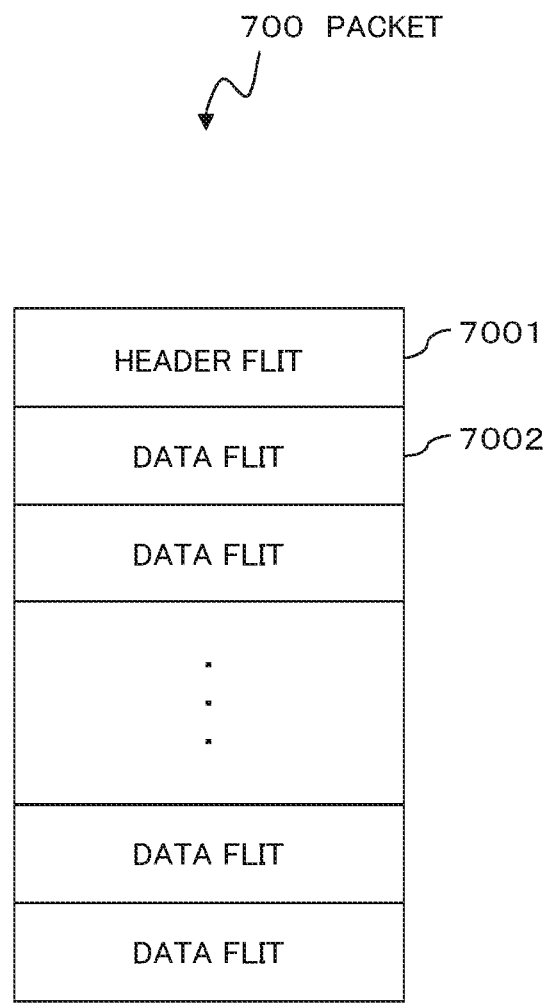
FIG. 5 is a diagram illustrating an example of structure of a packet in the related art.

Communication between the modules 40 is performed by transferring packets 700 each of which includes a plurality of flits as illustrated in FIG. 5. FIG. 5 is a diagram illustrating an example of structure of the packet 700. The packet 700 includes a header flit 7001 which includes information on a transfer destination (also called information necessary for path control), and a plurality of data flits 7002 which include data actually transferred. A data size of each data flit 7002 is corresponding to the number of the physical wires of the channel 20.

The module 40 generates the packet 700, and sends the generated packet 700 to the router 10.

In this case, the module 40 sends the header flit 7001 of the packet 700 to the router 10 firstly.

The packet 700 is generated by the module 40 is sent to the input-output control unit 150 of the router 10 included in the module 40.

The input-output control unit 150, which receives the packet 700 from the module 40, sends the header flit 7001 and the data flit 7002 of the received packet 700 in turn to the routing unit 160.

Receiving the header flit 7001, the routing unit 160 determines the input-output control unit 150 to which the packet 700 should be sent. Next, the routing unit 160 sends the header flit 7001 to the input-output control unit 150 which is determined as above. Furthermore, the routing unit 160 sends the data flit 7002 received from the input-output control unit 150 to the input-output control unit 150 which is determined as above.

Receiving the header flit 7001 and the data flit 7002 from the routing unit 160, the input-output control unit 150 sends the header flit 7001 and the data flit 7002 (packet 700) to the channel 20. The packet 700 is transferred to the router 10 of the adjacent module 40 through the channel 20.

Next, when the router 10 of the adjacent module 40 receives the packet 700 from the channel 20, the router 10 performs processing to the packet 700 similarly to the case of receiving the packet 700 from the module 40 as described above.

The process as described above is repeatedly performed at the router 10 of each module 40 until the packet 700 reaches the module 40 as a transfer destination.

In the case that the module 40 as the transfer destination receives the packet through the channel 20, the routing unit 160 outputs the received packet 700 to the core of the module 40 as the transfer destination.

The above described is explanation of the LSI chip 30 including the module 40 each having one router 10.

Next, a configuration and an operation of the LSI chip 31 of the present exemplary embodiment will be explained in comparison with the LSI chip 30 described above.

Figure 6:
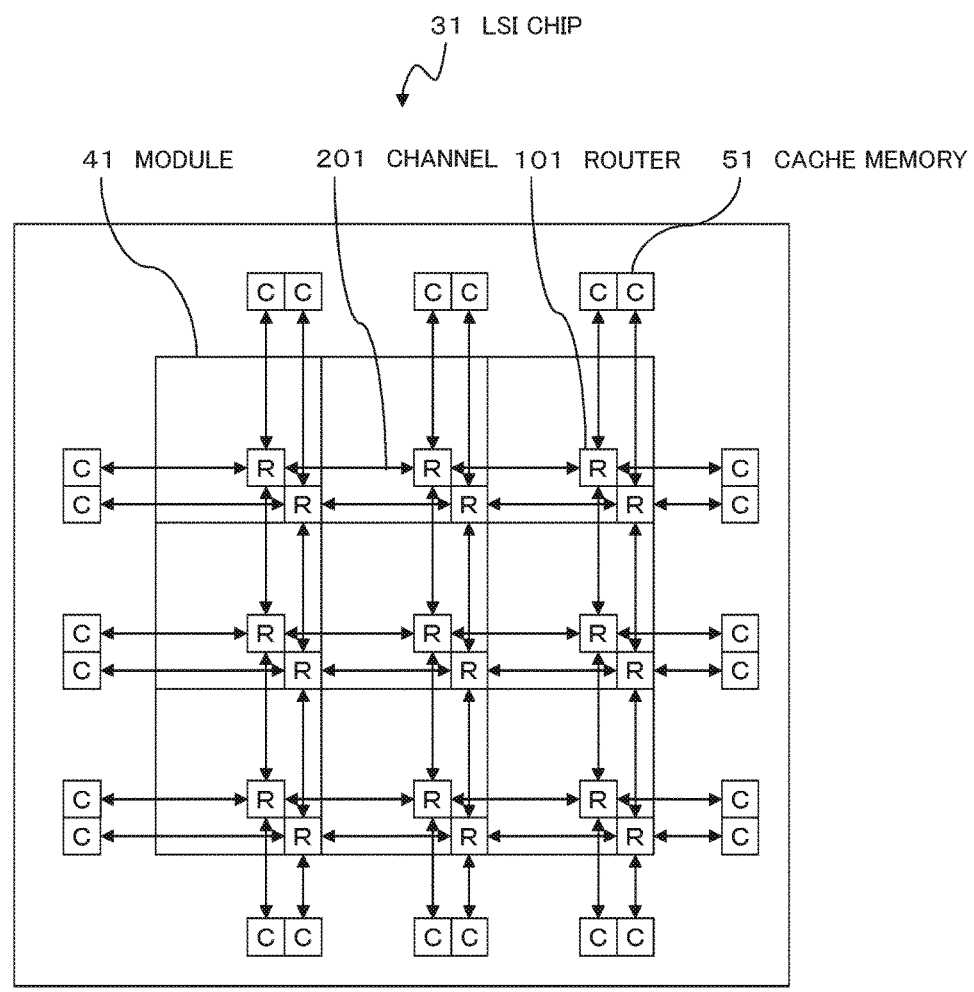
FIG. 6 is a block diagram illustrating a whole configuration of the LSI chip according to the first exemplary embodiment.

FIG. 6 is a block diagram illustrating a whole configuration of the LSI chip 31 of the present exemplary embodiment. The LSI chip 31 includes the plurality of modules 41 and a plurality of cache memories 51. FIG. 6 illustrates the LSI chip 31 which is corresponding to the LSI chip 30 illustrated in FIG. 2, and in which the router 10 is split into two routers 101.

Each module 41 includes the two routers 101 and a core (not illustrated in the drawing). Each router 101 is connected to the routers 101 of the adjacent modules 41 through channels 201. Here, it is assumed that number of the wires of the channel 201 is half of the number of the wires of the channel 20 illustrated in FIG. 2. In other words, it is assumed that the channel 20 is split into two channels 201 in the LSI chip 31.

Figure 7:
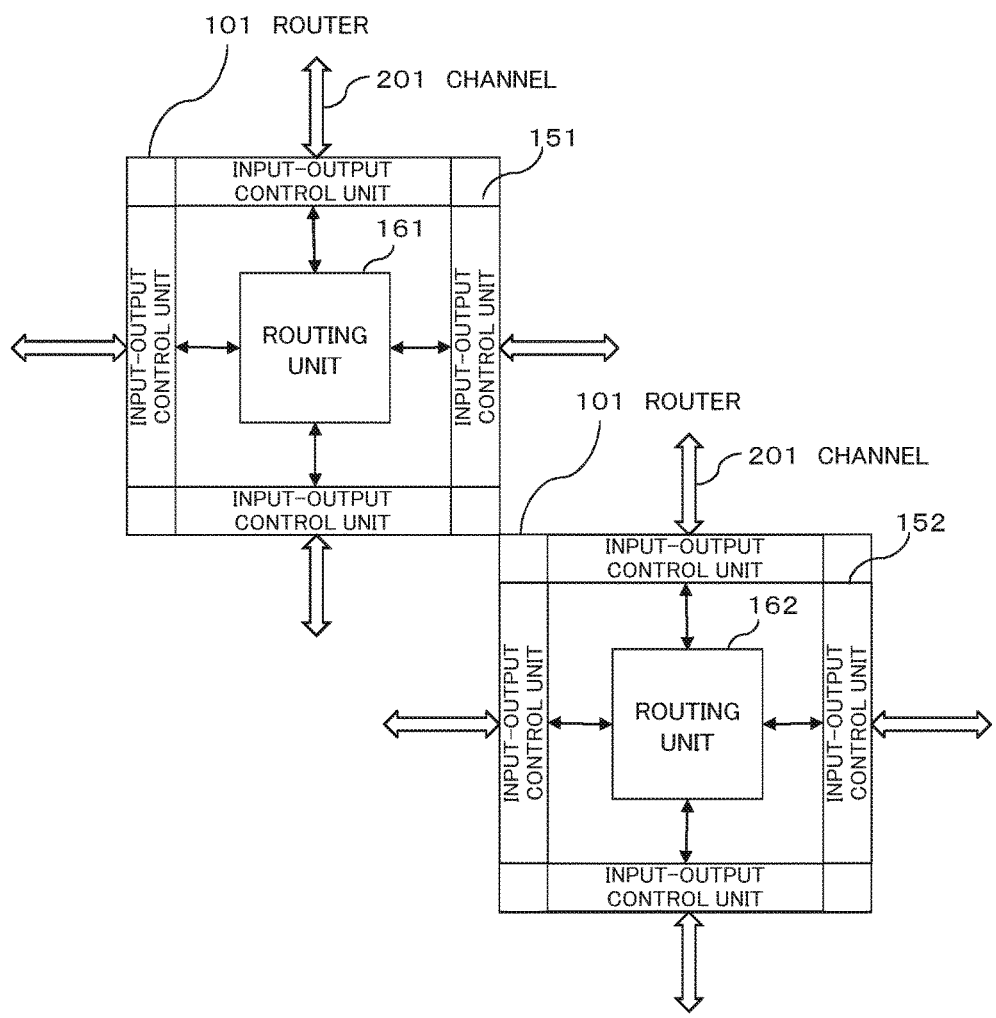
FIG. 7 is a block diagram illustrating a configuration of a router in the first exemplary embodiment.

FIG. 7 is a block diagram illustrating a configuration of the router 101. One out of the two routers 101 includes an input-output control unit 151 and a routing unit 161, and the other includes an input-output control unit 152 and a routing unit 162. The input-output control unit 151 and input-output control unit 152 are the units in which the input-and output control unit 101 is split into two parts, in correspondence with the channel 20 which is split into the two channels 201. Similarly, the routing unit 161 and the routing unit 162 are the units in which the routing unit 160 is split into two parts, in correspondence with the channel 20 which is split into the two channels 201.

The input-output control unit 151 and the input-output control unit 152 are respectively connected to one out of two channels 201 into which the channel 20 is split. Moreover, the input-output control unit 151 and the input-output control unit 152 are connected with the routing unit 161 and the routing unit 162 respectively.

Since a hardware volume of the router 101 is proportional to number of the physical wires included in the channel 201, the hardware volume of the router 101 is half of the hardware volume of the router 10. In other words, if number of the physical wires of the channel 20 is denoted as w, number of the physical wires of respective channel 201 is denoted as w/2.

Since an area occupied by the router 101 is proportional to the square of number of the physical wires included in the channel 201, the area occupied by the router 101 is a quarter of the area occupied by the router 10. In other words, if the area occupied by the router 10 is denoted as s, the area occupied by each router 101 is denoted as s/4.

That is, a total number of the physical wires of the channels 201 which corresponds to the module 41 illustrated in FIG. 1 is not changed in comparison with a case of the module 40 illustrated in FIG. 2. A total of the areas occupied by the routers 101 included in the module 41 illustrated in FIG. 1 is half of the area occupied by the router 10 illustrated in FIG. 10.

Notwithstanding the above-mentioned example, the module 41 may include any number of the routers 101. In other words, the channel 20 may be split into an arbitrary number of the channels 201. In this case, the input-output control unit 150 and the routing unit 160 may be split correspondingly to the channels 201 into which the channel 20 is split. For example, in the case that the channel 20 is split into n parts (n is an integer larger than 1), a total of number of the physical wires of the channels 201 corresponding to the module 41 in the LSI chip 31 of the present exemplary embodiment does not change in comparison with a total of number of the physical wires of the channel 20 corresponding to the module 40 in the LSI chip 30. Then, the total area occupied by the routers 101 is equal to one over n of the area occupied by the router 10. That is, the area occupied by the routers 101 is reduced.

Figure 8:
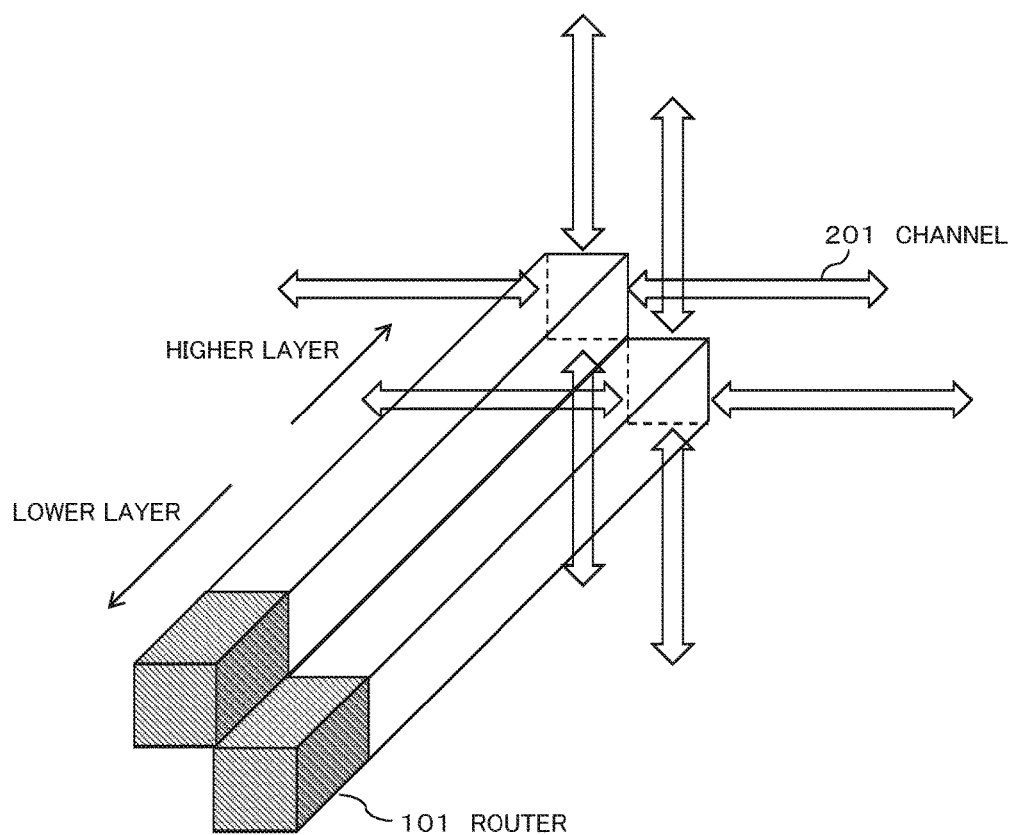
FIG. 8 is a perspective view of a router portion in the first exemplary embodiment.
Figure 9:
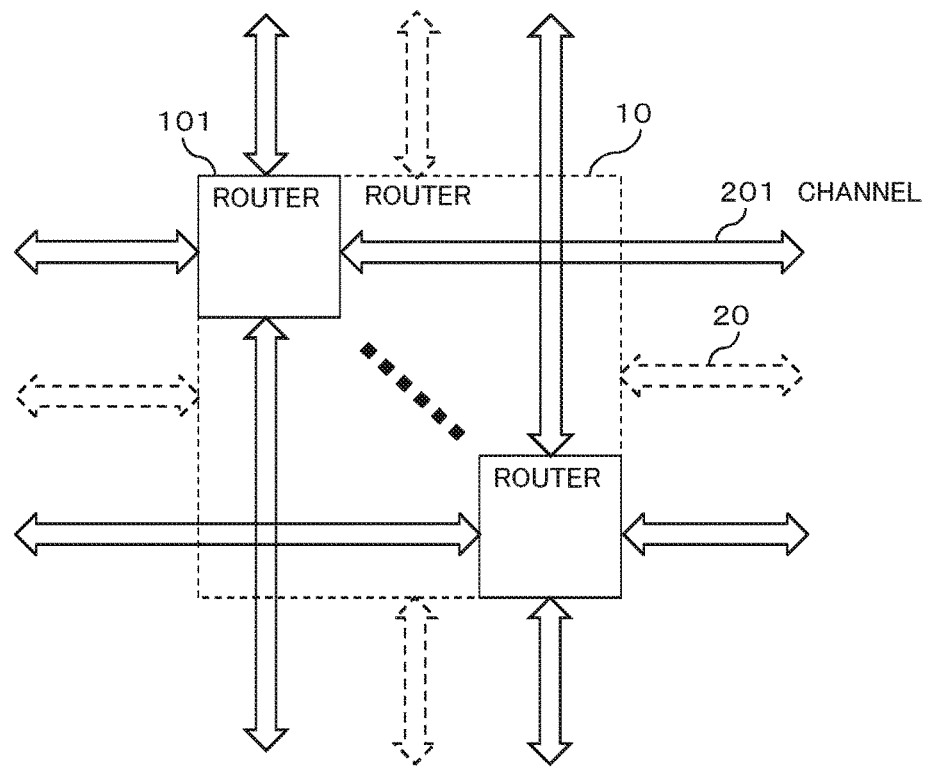
FIG. 9 is a diagram illustrating a comparison on a router and a channel between the first exemplary embodiment and the related art.

The area occupied by the router 101 will be explained using FIG. 8. FIG. 8 is a perspective view of the router 101 part of the module 41, by viewing the router 101 from a bottom surface side of the module 41 illustrated in FIG. 6. In FIG. 8, a lower layer side block, which is indicated by a slant line, is an area occupied by a logic circuit of the router 101. The physical wires of each channel 201 are connected to each side of the router 101. Accordingly, a length of each side of the router 101 is proportional to number of the physical wires, and the area occupied by the router 10 is proportional to the square of the number of the physical wires. That is, if the number of the physical wires of the channel 201 is half of the number of the physical wires of the channel 20, the length of the side of the router 101 is half of the length of the side of the router 10, and then the area occupied by the router 101 is a quarter of the area occupied by the router 10. FIG. 9 is a diagram illustrating comparison between the router 10 and the n routers 101, and comparison between the channel 20 and the n channels 201. In FIG. 9, the router 10 indicated by a dotted line corresponds to the router 10 illustrated in FIG. 2, and the channel 20 indicated by a dotted line corresponds to the channel 20 illustrated in FIG. 2. Moreover, in FIG. 9, the router 101 corresponds to the router 101 illustrated in FIG. 7, and the channel 201 corresponds to the channel 201 illustrated in FIG. 7.

Figure 10:
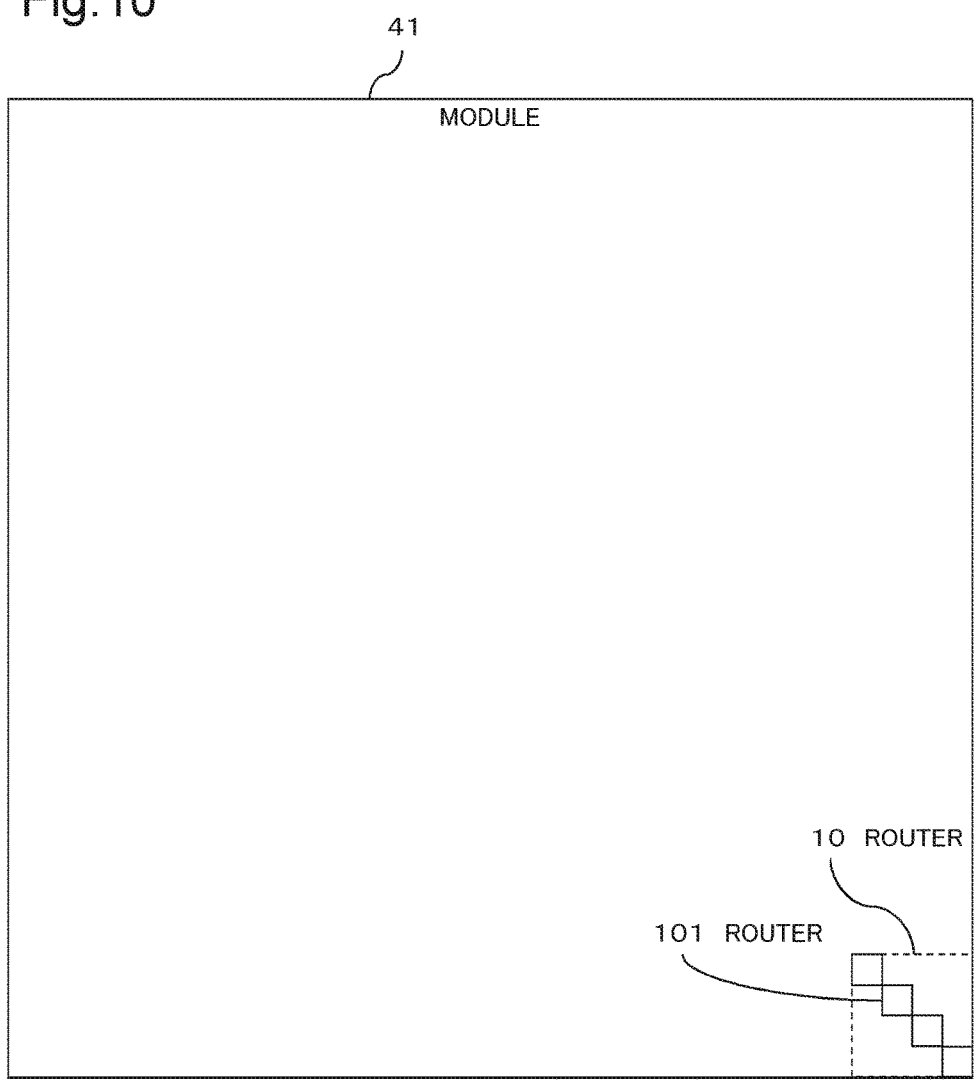
FIG. 10 is a block diagram illustrating an example of a configuration of a module in the first exemplary embodiment.

As illustrated in FIG. 9, the LSI chip 31 according to the present exemplary embodiment includes the n routers 101 which correspond to the router 10. In other words, the n routers 101 correspond to n routers into which the router 10 illustrated in FIG. 2 is split. Then, In the LSI chip 31 according to the present invention, routing data through the n channels 201, into which the channel 20 is split, are performed by the n routers 101 each of which performs independently. FIG. 10 is a diagram illustrating a configuration of the module 41 when the router 10 is divided into the four routers 101. In FIG. 10, a total number of the physical wires of the channels 201 which corresponds to the module 41 in the LSI chip 31 does not change in comparison with the number of the physical wires of the channel 20 which correspond to the module 40 in the LSI chip 30 illustrated in FIG. 2. In contrast, the total area occupied by the routers 101 is a quarter of the area occupied by the router 10.

Figure 11:
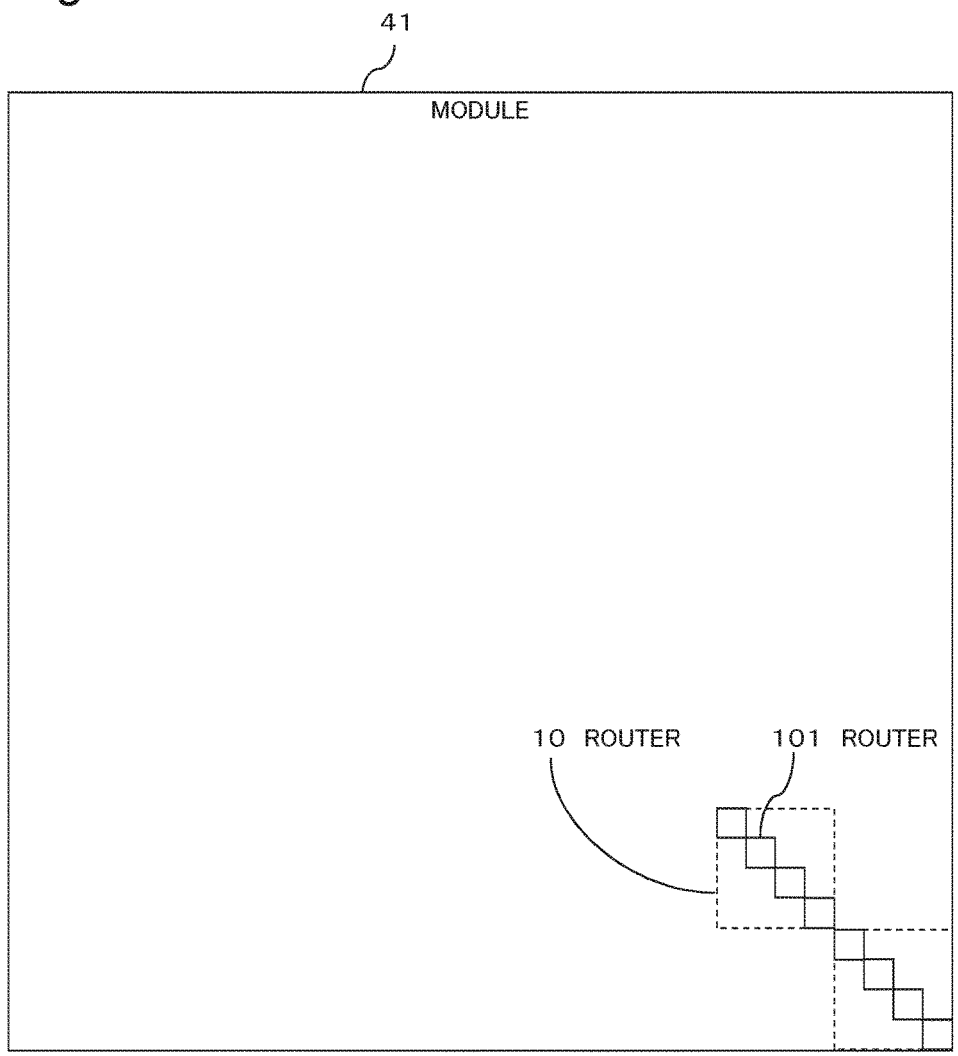
FIG. 11 is a block diagram illustrating an example of the configuration of the module in the first exemplary embodiment.

FIG. 11 is a diagram illustrating a configuration of the module 41 including two sets of the four routers 101 into which the router 10 is split. In FIG. 11, a total number of the physical wires of the channels 201 which corresponds to the module 41 in the LSI chip 31 is double of the number of the physical wires of the channel 20 which corresponds to the module 40 in the LSI chip 30 illustrated in FIG. 2. In contrast, the total area occupied by the routers 101 is half of the area occupied by the router 10. That is, the area occupied by the router is reduced to half, and throughput is improved two times.

Next, an operation of the LSI chip according to the present exemplary embodiment will be explained.

Figure 12:
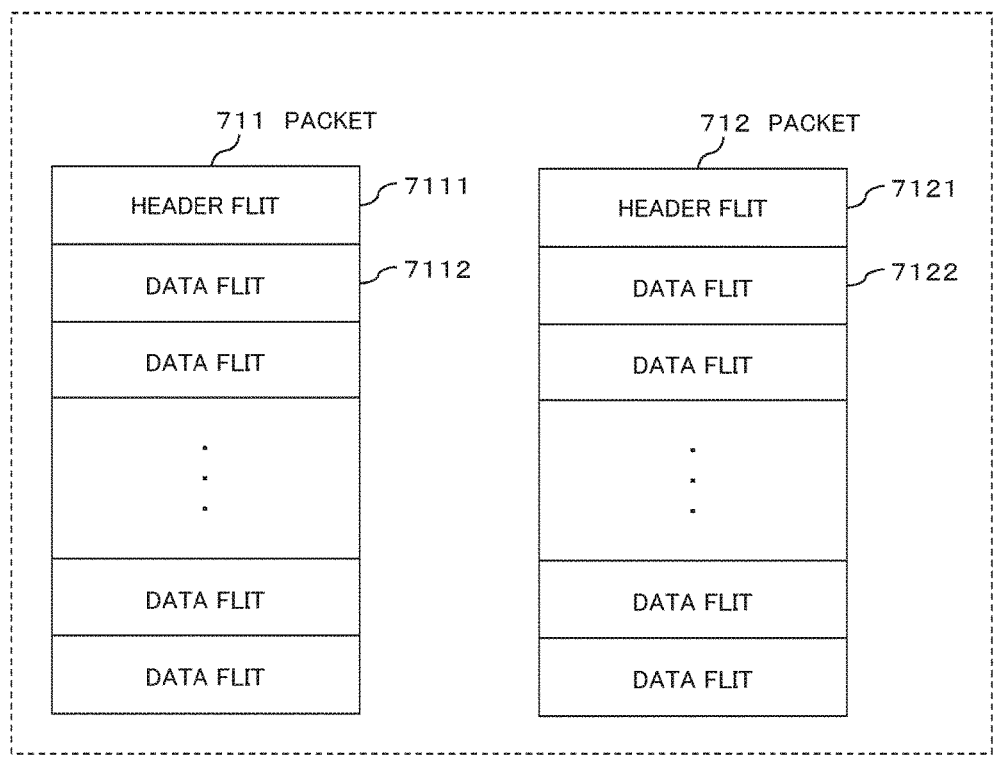
FIG. 12 is a diagram illustrating an example of structure of a packet in the first exemplary embodiment.

Communication between the modules 41 is performed by transferring a packet 711 and a packet 712 each of which includes a plurality of flits illustrated in FIG. 12. FIG. 12 is a diagram illustrating an example of structure of the packet 711 and the packet 712. The packet 711 includes a header flit 7111 and a plurality of data flits 7112, and the packet 712 includes a header flit 7121 and a plurality of data flits 7122. The header flit 7111 and the header flit 7121 include information on a transfer destination respectively. Similarly, each of the data flits 7112 and each of the data flits 7122 include actual transfer data respectively.

The packet 711 and the packet 712 illustrated in FIG. 12 can be obtained by dividing the packet 700 illustrated in FIG. 5 into two parts correspondingly to the two channels 201 into which the channel 20 is divided. If the channel 20 is divided into n parts, the packet 700 is correspondingly divided into n parts. Accordingly, a data size of each of the data flit 7112 and the data flit 7122 is half of the data size of the data flit 7002 of the channel 201 illustrated in FIG. 5. That is, the data size of each of the data flit 7112 and the data flit 7122 corresponds to the number of the physical wires of the channel 201.

The module 41 generates the packet 700, and divides the generated packet 700 into the packet 711 and the packet 712. When dividing the packet 700, the module 41 sets the header flit 7111 and the header flit 7121 the same contents. Then, the module 41 sends the packet 711 and the packet 712 to the corresponding routers 101 respectively.

In this case, the module 41 firstly sends the header flit 7111 of the packet 711 and the header flit 7121 of the packet 712 to the router 101.

The packet 711 are sent to the input-output control unit 151 of one of two routers 101 included in the module 41, and the packet 712 are sent to the input-output control unit 152 of one of two routers 101 included in the module 41.

When receiving the packet 711 from the module 41, the input-output control unit 151 sends the header flit 7111 and the data flit 7112 of the received packet 711 to the routing unit 161 in turn. Similarly, when receiving the packet 712 from the module 41. The input-output control unit 152 sends the header flit 7121 and the data flit 7122 of the received packet 712 to the routing unit 162 in turn.

The routing unit 161, when receiving the header flit 7111, determines the input-output control unit 151 to which the packet 711 should be sent. In addition, the routing unit 162, when receiving the header flit 7121, determines the input-output control unit 152 to which the packet 712 should be sent.

Next, the routing unit 161 sends the header flit 7111 to the input-output control unit 151 determined as above, and the routing unit 162 sends the header flit 7121 to the input-output control unit 152 determined as above. Furthermore, the routing unit 161 sends the received data flit 7112 to the input-output control unit 151 determined as above, and the routing unit 162 sends the received data flit 7122 to the input-output control unit 152 determined as above.

When receiving the header flit 7111 and the data flit 7112 from the routing unit 161, the input-output control unit 151 sends the header flit 7111 and the data flit 7112 (packet 711) to the channel 201. Similarly, when receiving the header flit 7121 and the data flit 7122 from the routing unit 162, the input-output control unit 152 sends the header flit 7121 and the data flit 7112 (packet 712) to the channel 201.

The channels 201 transfer both of the packet 711 and the packet 712 to the routers 101 of the adjacent module 41.

Next, the router 101 of the adjacent module 41 processes the packet 711 and the packet 712, which are received from the channels 201, similarly to the case of receiving the packet 711 and the packet 712 from the module 41.

The above-mentioned process performed by the router 101 of each module 4,1 is repeated until the packet 711 and the packet 712 reach the module 41 of the transfer destination.

In the module 41 which is the transfer destination, when the routing unit 161 receives the packet 711 through the channel 201, the routing unit 161 outputs the received packet 711 to the core of the module 41 of the transfer destination. In the module 41 which is the transfer destination, when the routing unit 162 receives the packet 712 through the channel 201, the routing unit 162 outputs the received packet 712 to the core of the module 41 which is the transfer destination.

As described above, the LSI chip 31 transfers the packet 711 and the packet 712, into which the packet 700 is divided, as an independent packet.

The above described is the explanation on the operation of the present exemplary embodiment. That is, the above described is the explanation on the LSI chip 31 of the present exemplary embodiment in comparison with the LSI chip 30 illustrated in FIG. 2.

The first exemplary embodiment as described above has an advantageous effect in a point that it is possible for a semiconductor chip applying network on chip architecture to more preferably reduce the area occupied by a router included in the semiconductor chip under the condition of a predetermined data transfer throughput.

The reason is that the LSI chip 31 according to the first exemplary embodiment has the following configuration. First, one of the modules 41 transfers data to the other module 41 through the plurality of first routers 101 included in the module 41. Second, the first routers 101 send and receive data with the second routers 101 included in the other module 41. Each of the second routers 101 corresponds to the first router 101.

<<<First Modification of the First Exemplary Embodiment>>>

According to a present modification, the number of the channels 201 per the module 41 is determined based on a relation between the minimum occupied area Sw and the minimum occupied area Sg. The minimum occupied area Sw denotes the minimum area occupied by the router 101 which is determined by the number of the physical wires included in the channel 201. The minimum occupied area Sg denotes the minimum area occupied by the router 101 which is determined by a hardware volume (buffer size of the input-output control unit 150) of the router 101. Here, it is conceivable that the number of the channels 201 per the module 41 corresponds to division number when the total area occupied by all of the routers 101 included in the module 41 is assumed to be a predetermined value (for example, the area occupied by the router 10 illustrated in FIG. 2).

For example, the number of the channels 201 per the module 41 is the maximum number of the channels 201 which satisfies the condition that the minimum occupied area Sw is equal to the minimum occupied area Sg or more. As described above, the minimum occupied area Sw of the router 101 is proportional to the square of the number of the physical wires included in the channel 201, and the hardware volume is proportional to the buffer size of the input-output control unit 150, that is, the number of the physical wires which are included in the channel 201. That is, if the division number is denoted as n, the minimum occupied area Sw of the router 101 is proportional to one over the square of n, and the hardware volume of the router 101 is proportional to one over n. Accordingly, if the division number (the number of the routers 101) is increased, and when the division number exceeds a certain value N, the minimum occupied area Sg determined by the hardware volume of the router 101 becomes larger than the minimum occupied area Sw of the router 101. In this case, the certain value N may be determined as the division number.

Figure 13:
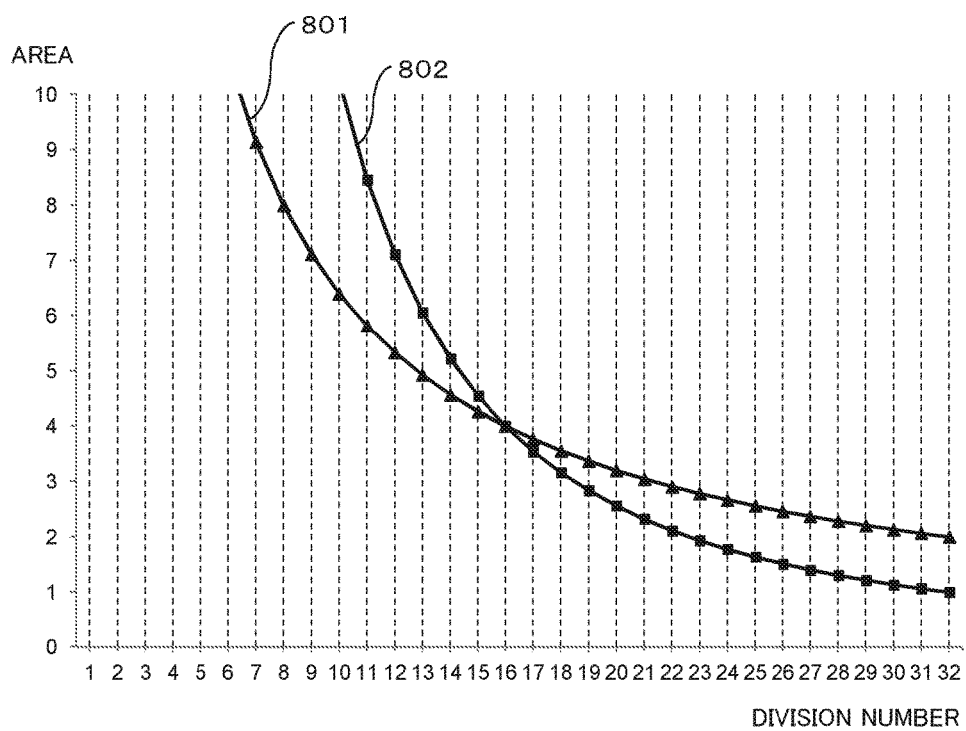
FIG. 13 is a graph with respect to an area occupied by a router in the first exemplary embodiment.

FIG. 13 is a graph illustrating a relation between the minimum occupied area Sw which is the minimum area occupied by the router 101 determined by the number of the physical wires of the channel 201 and, and the minimum occupied area Sg which is the minimum area occupied by the router 101 determined by the hardware volume of the router 101. In FIG. 13, the horizontal axis indicates the division number, and the vertical axis indicates the occupied area. In addition, the minimum occupied area Sg is indicated by a black triangle on an approximation curve 801, and the minimum occupied area Sw is indicated by a black square on an approximation curve 802. According to FIG. 13, the approximation curve 801 (minimum occupied area Sg) and the approximation curve 802 (minimum occupied area Sw) cross when the division number is 16, and the approximation curve 801 exceeds the approximation curve 802 when the division number is 17. Accordingly, it is possible to determine that the above-mentioned N is 16.

The first modification in the present exemplary embodiment has an advantageous effect in a point that it is possible to obtain the LSI chip 31 having the module 41 which includes the preferable number of the routers 101.

The reason is that the number of the channels 201 per the module 41 can be determined based on the relation between the minimum occupied area Sw and the minimum occupied area Sg in this modification.

<<<Second Modification of the First Exemplary Embodiment>>>

According to a present modification, physical wires which are arranged at a higher layer of the LSI chip 31 than a physical wire corresponding to another wiring (not illustrated) are assigned to the channel 201.

One of tasks of the semiconductor chip such as the LSI chip 31 is to achieve lower latency and less power consumption.

In order to achieve low latency in data transfer which is carried out by network on chip, it is necessary to assign a physical wire having a wide wiring width and arranged at a higher layer to the channel 20 illustrated in FIG. 2 and the channel 201 illustrated in FIG. 7, for example. Similarly, in order to achieve low power consumption, it is necessary that the higher layer wire is assigned to the channel 20 and the channel 201. However, the wider the width of the physical wire assigned to the channel 20 or the channel 201, the larger the area occupied by the channel 20 or the channel 201.

That is, in order to realize the LSI chip 30 or the LSI chip 31 which have low latency and low power consumption, it is necessary to assign physical wires arranged at a layer as high as possible to the channel 20 or the channel 201. However, if the physical wires are assigned as described above, there is a problem that, as the area occupied by the router 10 or the router 101 become large when the wires arranged at the higher layer are used.

Here, it is assumed that a size of transfer data between the modules 40 illustrated in FIG. 2 and a size of transfer data between the modules 41 illustrated in FIG. 6 are the same. That is, it is assumed that the number of the physical wires of the channel 20 and the total number of the physical wires of the channels 201 which correspond to the module 41 are the same. In this case, if the width of the channel 20 and the width of the channel 201 are the same, the total area occupied by the routers 101, which are included in the module 41, is half of the area occupied by the router 10. Accordingly, if the width of the physical wire of the channel 201 is equal to or narrower than 'square root of 2' times of the width of the physical wire of the channel 20, a total of the occupied areas of the routers 101, which are included in the module 41, is equal to or smaller than the occupied area by the router 10. Therefore, under the condition that a total of the area occupied by the routers 101 included in the module 41 and the area occupied by the router 10 are the same, it is possible to assign the physical wire arranged at the higher layer can be assigned to the channel 201, as the router 10 is divided into the more routers 101.

In the present modification, the physical wires, which is arranged at the higher layer of the LSI chip 31 in comparison with a physical wire corresponding to another wiring (not illustrated in the drawing) which can be assigned based on the above-mentioned condition, are assigned to the channel 201

The second modification in the present exemplary embodiment as described above has an advantageous effect in a point that it is possible to realize the low latency and the low power consumption more preferably.

The reason is that the physical wire, which is arranged at the higher layer of the LSI chip 31 in comparison with the physical wire corresponding to the other wiring (not illustrated in the drawing), can be assigned to the channel 201 in this modification.

In other words, the reason is that, even if the area occupied by the router 101 is increased by assigning the physical wire arranged at the higher layer and having the wide width to the channel 201, the total area occupied by the routers 101 does not exceed the area occupied by the router 10, because the LSI chip 31 includes the plurality of routers 101 into which the router 10 is divided.

<<<Third Modification of the First Exemplary Embodiment>>>

Figure 14:
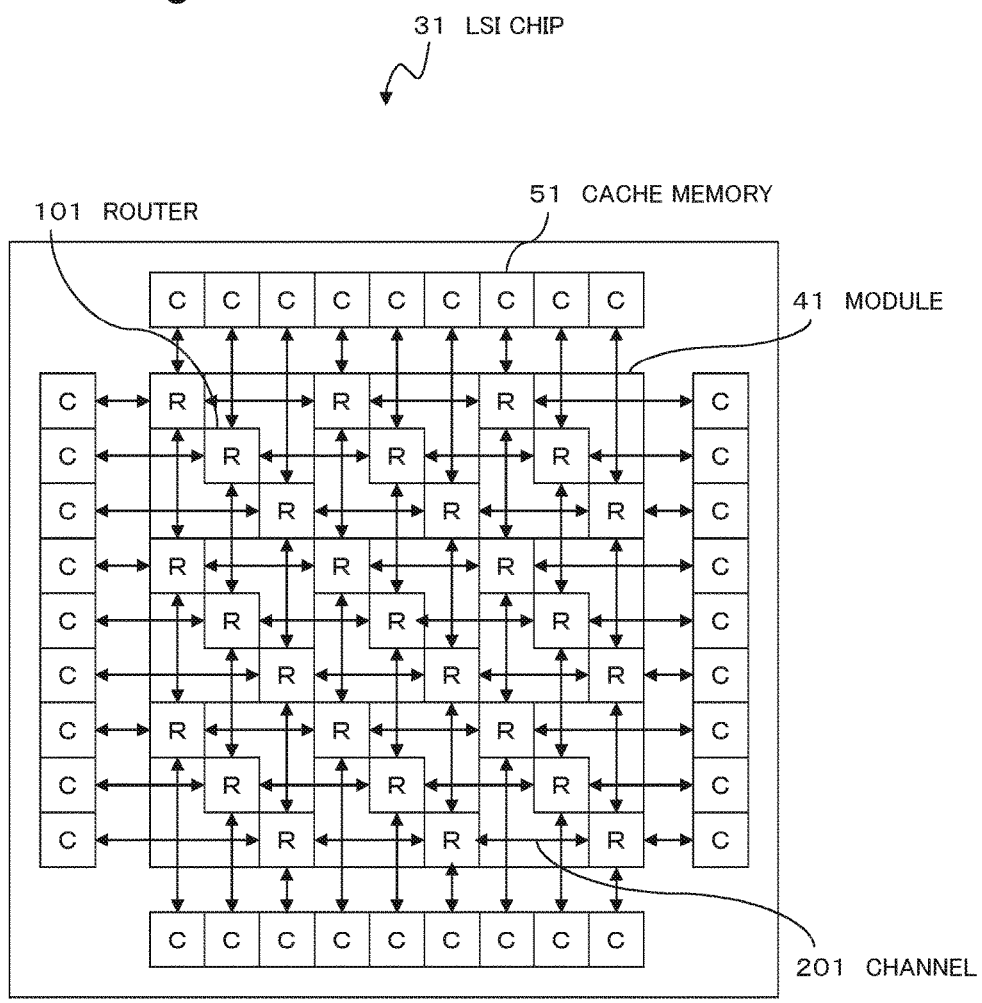
FIG. 14 is a block diagram illustrating an example of a configuration of the LSI chip according to a third modification of the first exemplary embodiment.
Figure 15:
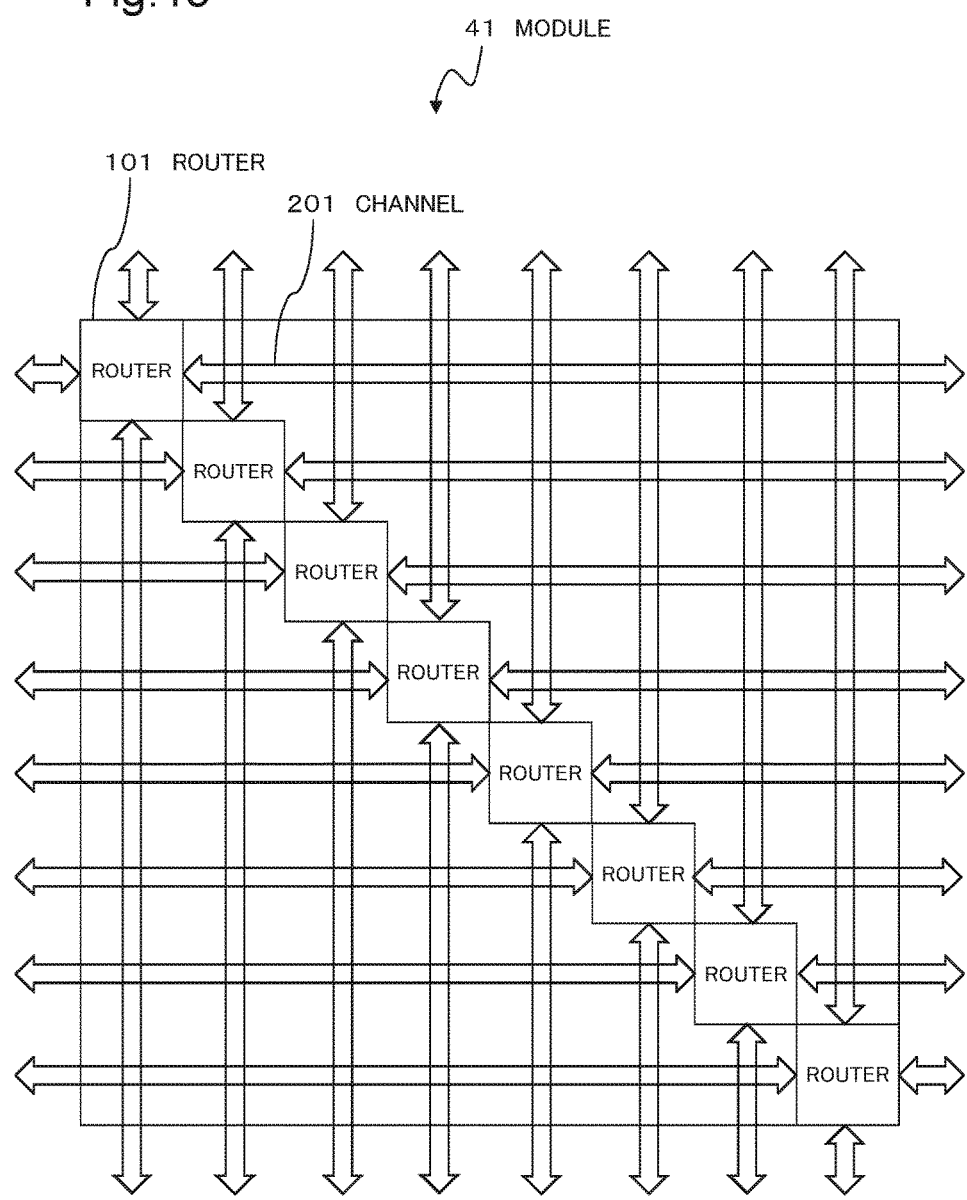
FIG. 15 is a block diagram illustrating another example of the configuration of the LSI chip according to the third modification of the first exemplary embodiment.

According to a present modification, all of the physical wires arranged at the higher layer (including the highest layer and a layer adjacent to the highest layer) and corresponding to each of the modules 41 are assigned to the channel 201. FIG. 14 is a block diagram illustrating an example of a configuration of the LSI chip 31 according to the present modification. The LSI chip 31 illustrated in FIG. 14 includes the module 41 including the 3 routers 101 into which the router 10 is divided, on the assumption that the area occupied by the router 10 is substantially the same as the area occupied by the module 41. FIG. 15 is a block diagram illustrating another example of a configuration of the LSI chip 31 according to the present modification. The module 41 illustrated in FIG. 15 includes the 8 routers 101 into which the router 10 is divided, on the assumption that the area occupied by the router 10 is substantially the same as the area occupied by the module 41. In the example illustrated in FIG. 14 and FIG. 15, the channels 201 in the vertical direction are assigned to all of the physical wires arranged at the highest layer corresponding to the module 41. Similarly, in the example illustrated in FIG. 14 and FIG. 15, the channels 201 in the horizontal direction are assigned to all of the physical wires arranged at a layer adjacent to the highest layer.

By virtue of the configurations illustrated in FIG. 14 and FIG. 15, it is possible to minimize the latency and the power consumption in a view point of the width of the physical wire.

The third modification in the present exemplary embodiment as described above has an advantageous effect in a point that it is possible to realize the low latency and the low power consumption more preferably.

The reason is that the physical wire, arranged at the highest layer and the layer adjacent to the highest layer of the LSI chip 31 can be assigned to the channel 201 in this modification.

<<<Fourth Modification of the First Exemplary Embodiment>>>

Figure 16:
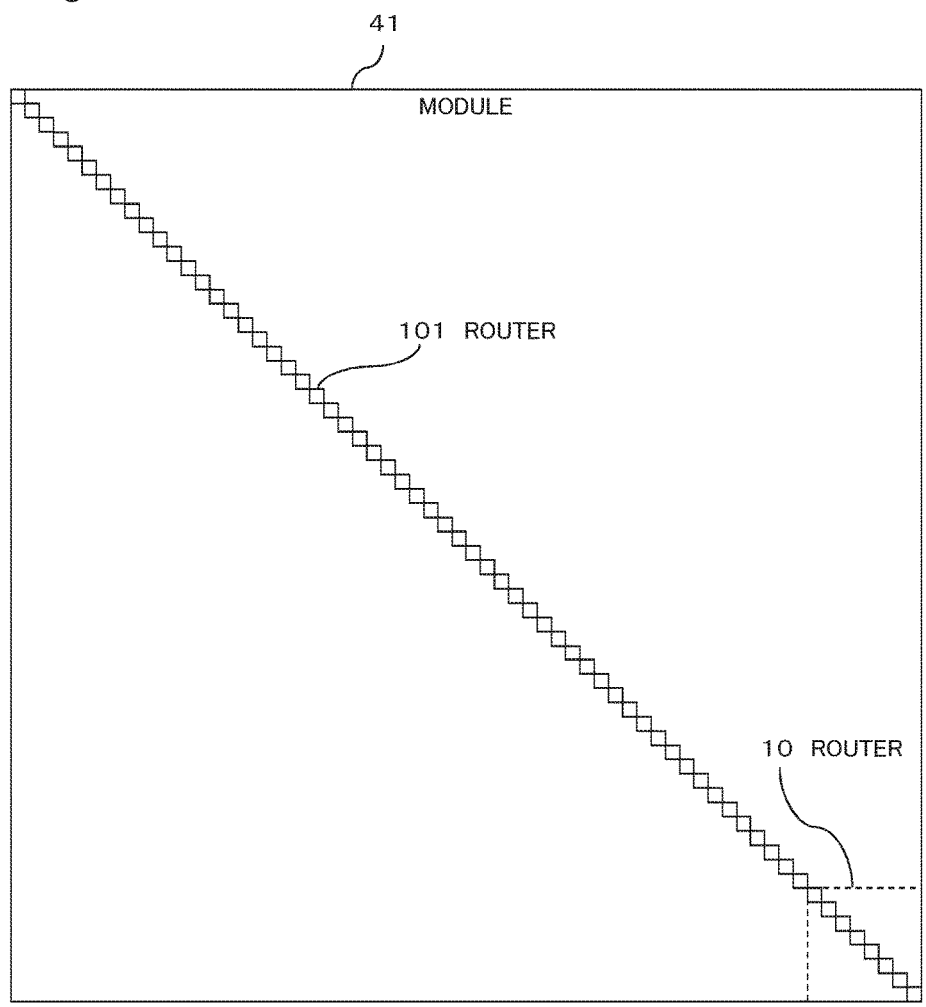
FIG. 16 is a block diagram illustrating an example of a configuration of the LSI chip according to a fourth modification of the first exemplary embodiment.

FIG. 16 is a block diagram illustrating an example of the configuration of the module 41 in a present modification. The module 41 illustrated in FIG. 16 includes the 64 routers 101. In the present modification illustrated in FIG. 16, the router 10, which has the occupied area corresponding to 1 over 64 of the area of the module 41, is divided into the 8 routers 101. Here, the router 10 indicated by a dotted line in FIG. 16 is described for explanation, and not included in the module 41. Moreover, it is assumed that the channel 20 (not illustrated in FIG. 16) which corresponds to the router 10 is assigned the physical wire arranged at the highest layer or the layer adjacent to the highest layer. In this case, the total area occupied by the router 101 does not change from the area occupied by the router 10, and a transfer channel size of the module 41 is 8 times as large as the transfer channel size when the number of the router 10 is one.

Figure 17:
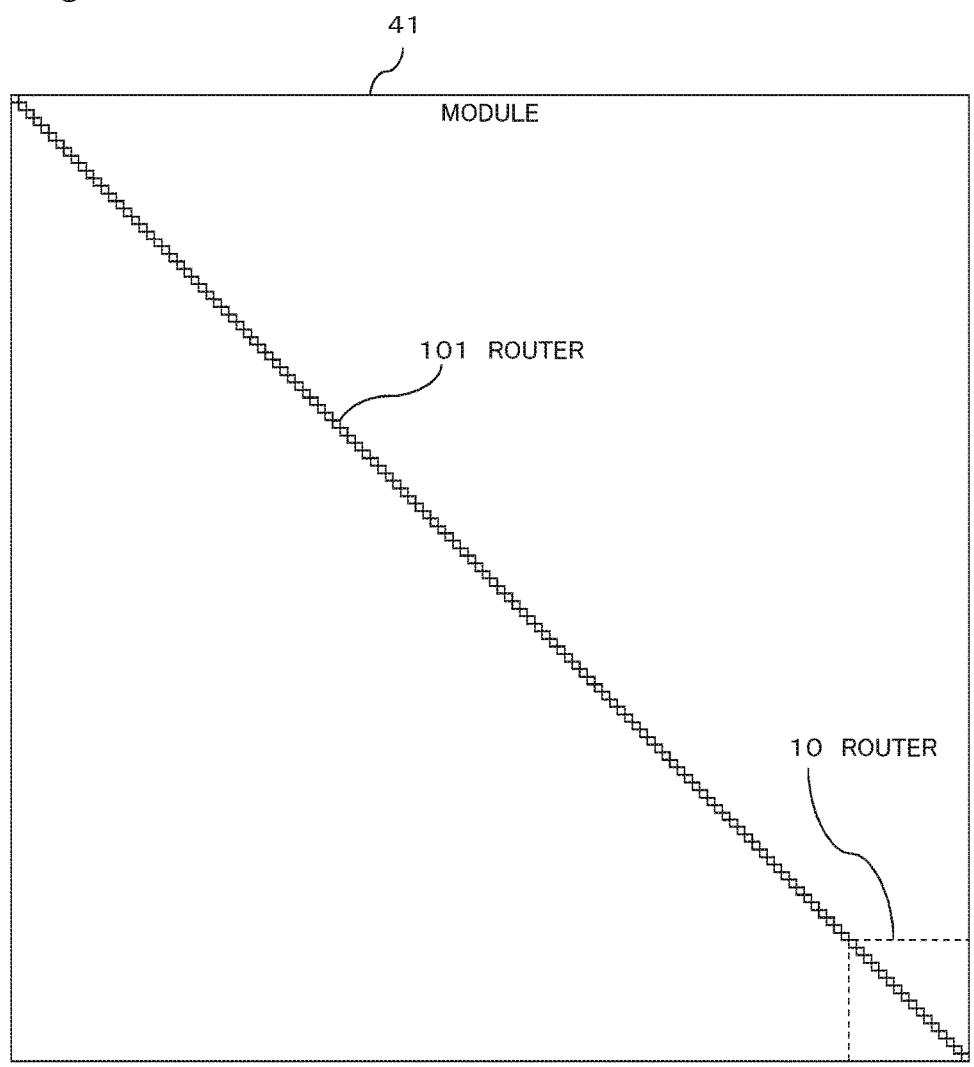
FIG. 17 is a block diagram illustrating another example of the configuration of the LSI chip according to the fourth modification of the first exemplary embodiment.

FIG. 17 is a block diagram illustrating another example of the configuration of the module 41 in the present modification. The module 41 illustrated in FIG. 17 includes the 128 routers 101. In FIG. 17, the router 10, which has the occupied area corresponding to 1 over 64 of the area of the module 41, is divided into the 16 routers 101. Here, the router 10 indicated by a dotted line in FIG. 17 is described for explanation and is not included in the module 41. Moreover, it is assumed that the channel 20 (not illustrated in FIG. 16) which corresponds to the router 10 is assigned the physical wire arranged at the highest layer or the layer adjacent to the highest layer. In this case, the total areas occupied by the router 101 is half of the area occupied by the router 10, and the transfer channel size of the module 41 is 8 times as large as the transfer channel size when the number of the router 10 is one.

By virtue of the configurations illustrated FIG. 16 and FIG. 17, it is possible to increase the transfer channel size of the module 41.

Figure 18:
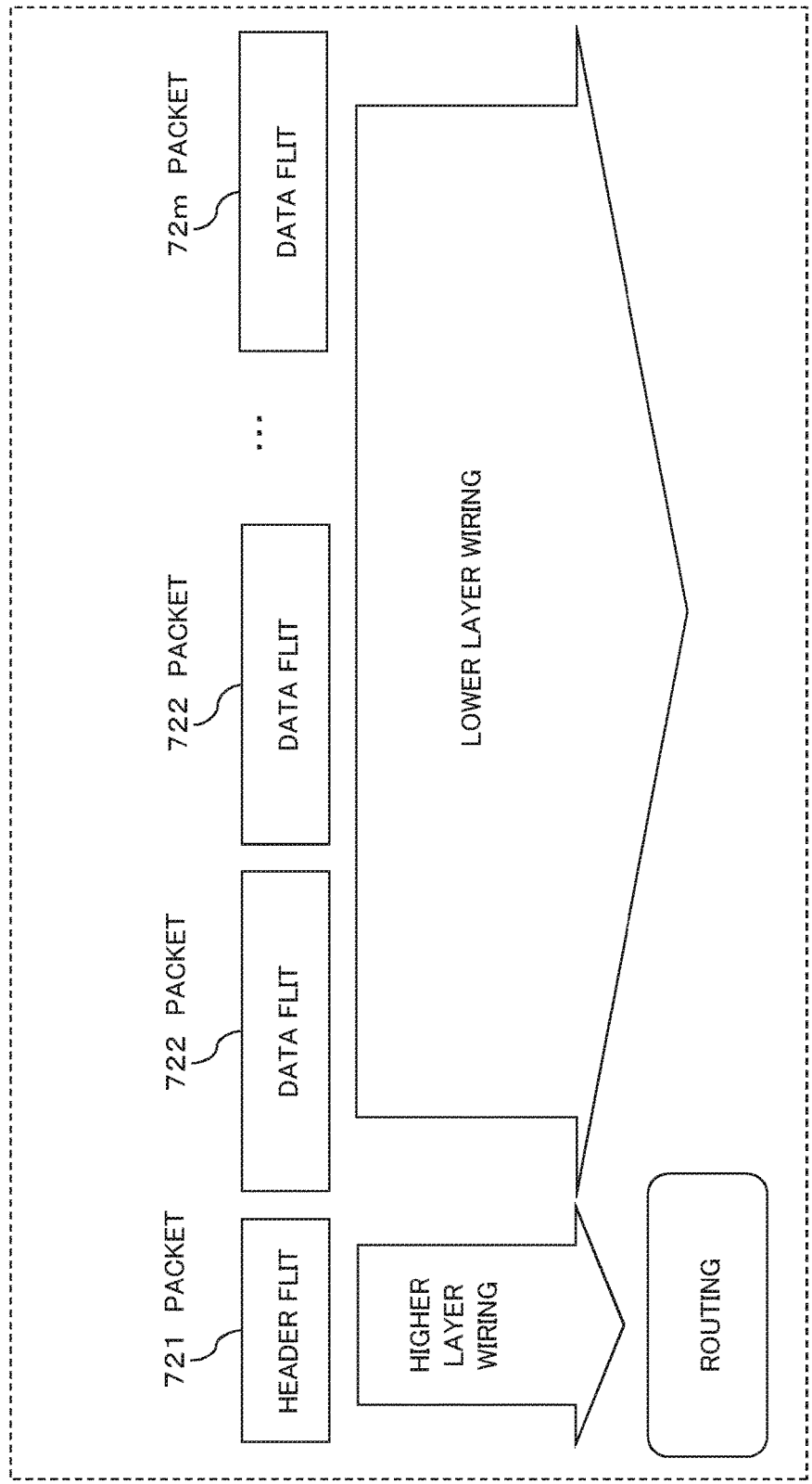
FIG. 18 is a diagram illustrating an example of structure of a packet in the fourth modification of the first exemplary embodiment.

Moreover, in the case that the increased transfer channel size of the module 41 is larger than or equal to a value acquired by adding a bit width of the header flit 7001 illustrated in FIG. 5 and bit widths of all of the data flits 7002, the module 41 may transfer a packet 721 to 72m (m is a natural integer) each of which has the structure illustrated in FIG. 18. FIG. 18 is a diagram illustrating an example of the structure of the packets 721 to 72m in the present modification. The packets 721 to 72m illustrated in FIG. 18 have structure not to transfer the flits through a plurality of stages as the packet 700 illustrated in FIG. 5, but to transfer the header flit 7001 and the data flits 7002 through a single stage. That is, a header flit included in the packet 721 illustrated in FIG. 18 corresponds to the header flit 7001 illustrated in FIG. 5, and data flits included in the packets 722 to 72m are corresponding the data flits 7002 illustrated in FIG. 5 respectively.

The fourth modification in the present exemplary embodiment as described above has an advantageous effect in a point that it is possible to increase the transfer data size without making the total areas occupied by the channels 201 exceed the occupied area of the channel 20, and without causing degradation of the latency. The reason is that all of the physical wires arranged at the higher layer (the highest layer or the layer adjacent to the highest layer) which corresponds to the module 41 are assigned to the channels 201.

<<<Second Exemplary Embodiment>>>

Next, a second exemplary embodiment of the present invention will be described in detail with reference to the drawings. Hereinafter, description of portions overlapping the earlier description will be omitted within a range not to obscure the description of the second exemplary embodiment.

Figure 19:
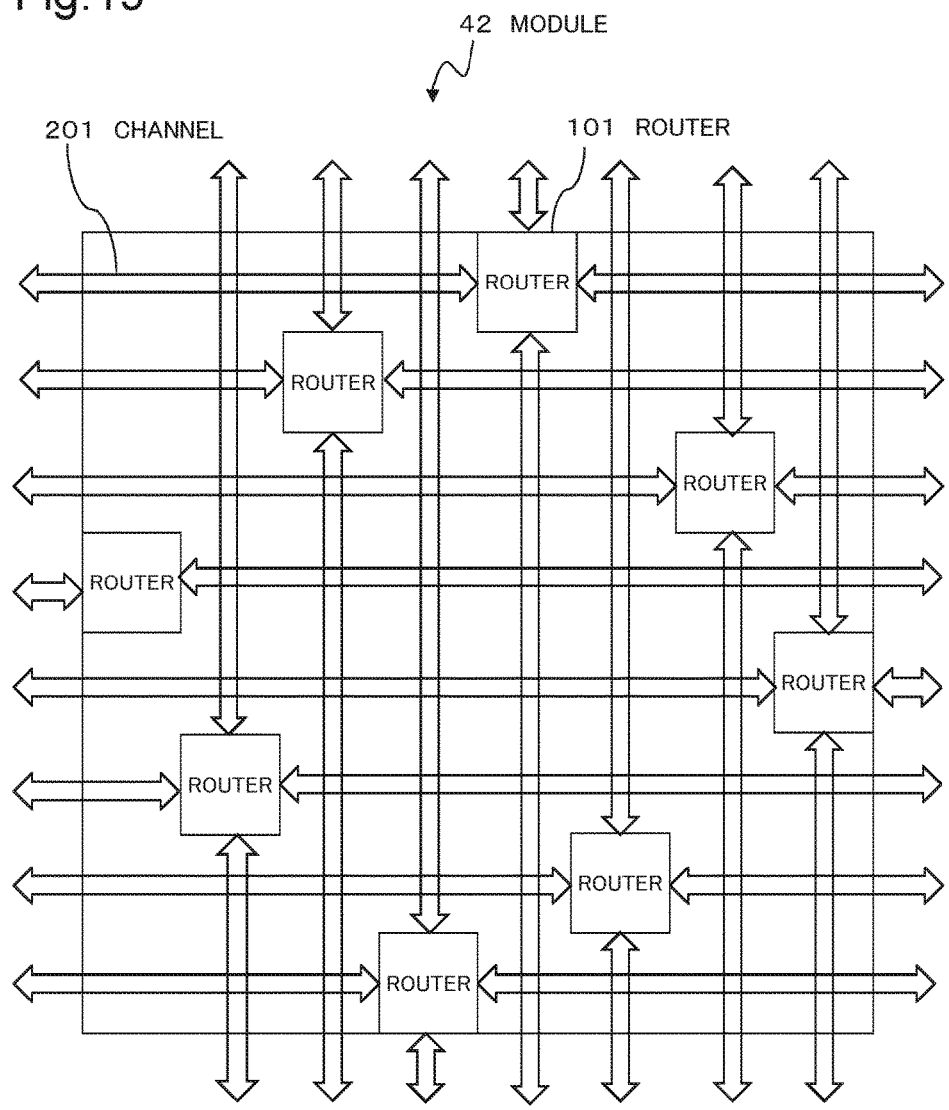
FIG. 19 is a block diagram illustrating an example of a configuration of a module in a second exemplary embodiment.

FIG. 19 is a block diagram illustrating an example of a configuration of a module 42 in the second exemplary embodiment. According to the module 42 of the second exemplary embodiment illustrated in FIG. 19, the routers 101 of the module 42 are arranged so that a distance of each router 101 from a center of the module 42 may become uniform in comparison with, for example, the module 41 illustrated in FIG. 15. Here, FIG. 15 illustrates the module 41 in which the routers 101 are arranged on diagonals.

Figure 20:
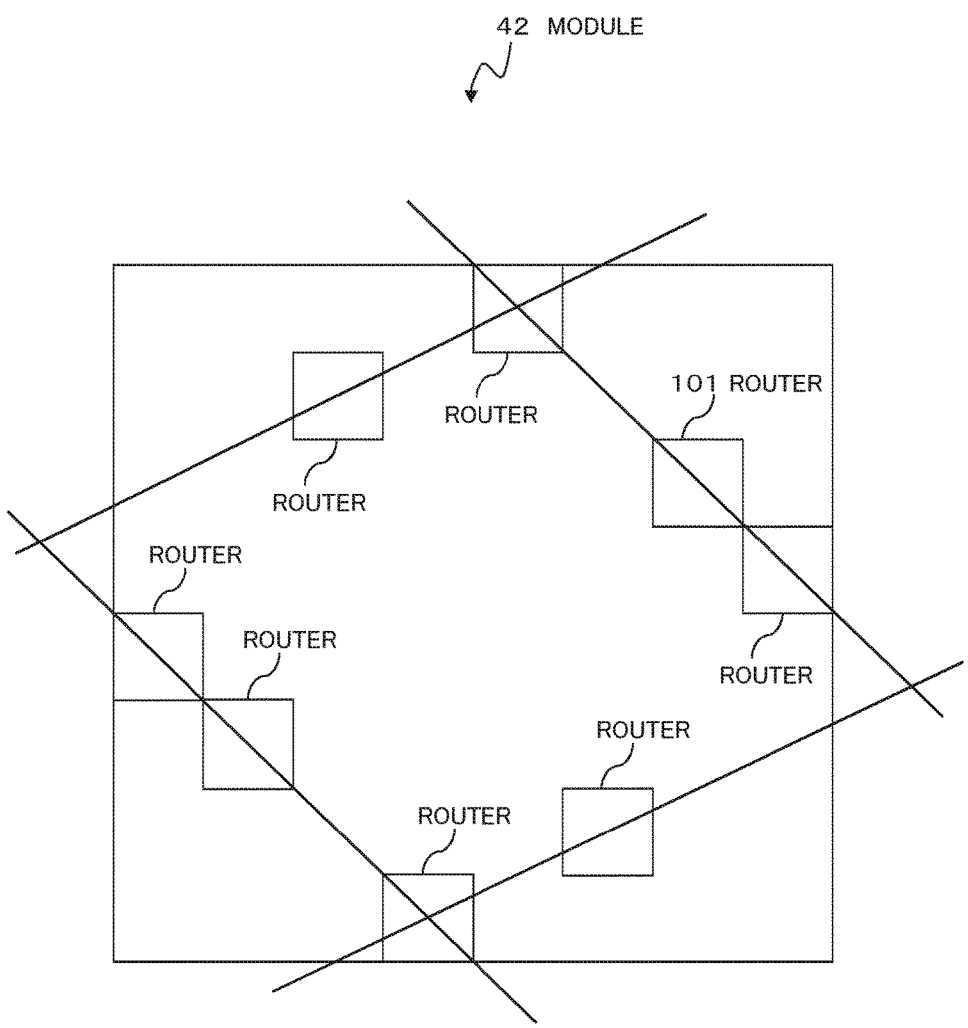
FIG. 20 is a block diagram illustrating routers arranged on a figure, which is an approximate rhombus, in the second exemplary embodiment.
Figure 21:
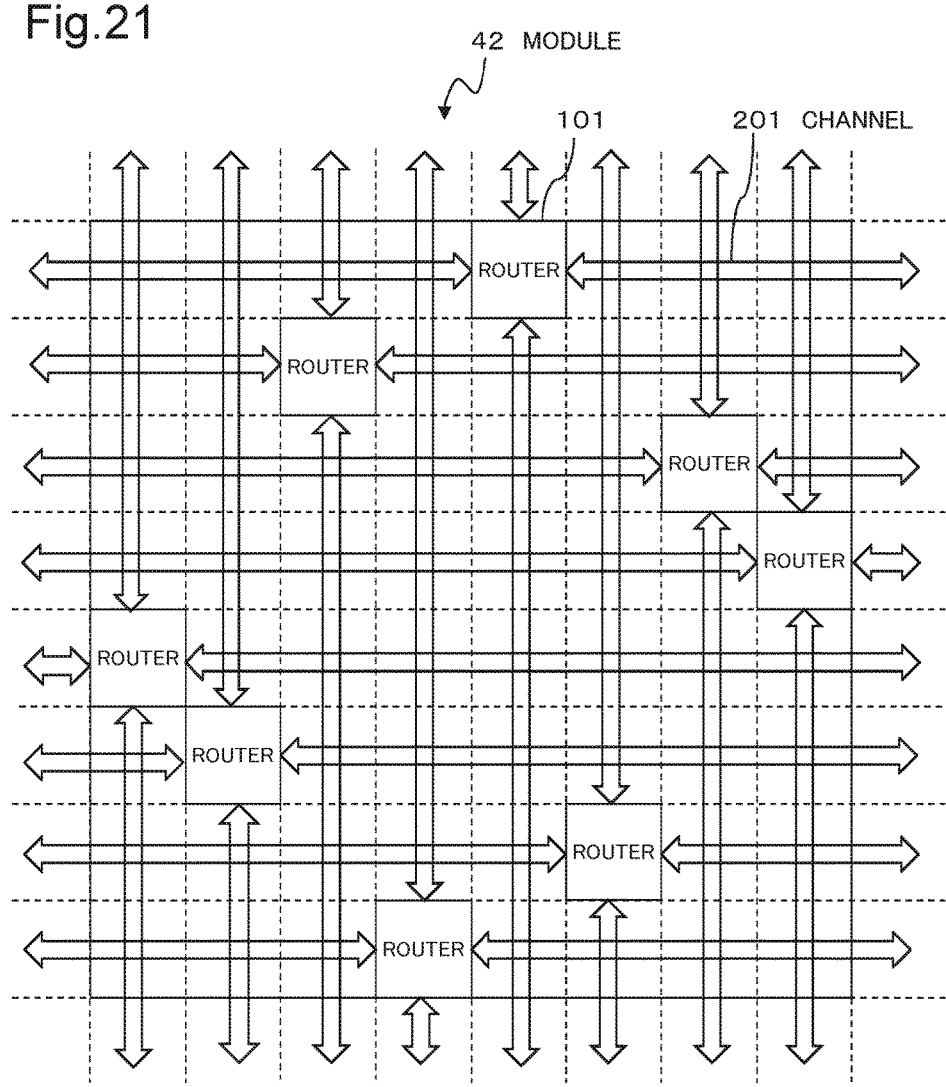
FIG. 21 is a diagram illustrating a straight line drawn through a side of a router indicated by a dotted line in the second exemplary embodiment.

For example, FIG. 20 is a diagram illustrating that the routers 101 of the module 42 are arranged so that a maximum closed figure composed of straight lines drawn through centers of each of the plurality of routers 101 may be a substantially rhombus. In other words, FIG. 20 illustrates that the routers 101 of the module 42 are arranged on sides of the rhombus so that the distance between each of the router 101 and the center of the module 42 can be as equal as possible. It should be noted that description of the channel 201 is omitted in FIG. 20. FIG. 21 is a diagram illustrating that a straight line, drawn through each sides of the router 101 is indicated by a dotted line. As illustrated in FIG. 21, the routers 101 of the module 42 are arranged in a state that a coordinate of each router 101 is shifted so that an area extended from the each side of the router 101 in a direction of the physical wire (wiring) of the channel 201 connected with the side does not overlap with each other. That is, even if the routers 101 of the module 42 are arranged in the shape of the approximate rhombus, it is possible to assign the physical wires arranged at the highest layer and the layer adjacent to the highest layer to the channels 201, similarly to the case that the routers 101 are arranged on the diagonals in the module 41.

In addition to the advantageous effect of the first exemplary embodiment, the above-mentioned second exemplary embodiment has an advantageous effect in a point that reduction of latency in connection with a core of the module 42 (not illustrated in the drawing) and better routability can be achieved.

The reason is that the routers 101 are arranged so that the distance of each router 101 from the center of the module 41 may be more uniform.

<<<Third Exemplary Embodiment>>>

Next, a third exemplary embodiment of the present invention will be explained in detail with reference to drawings. Hereinafter, explanation overlapping with the earlier description will be omitted within a range not to obscure the description of the second exemplary embodiment.

Figure 22:
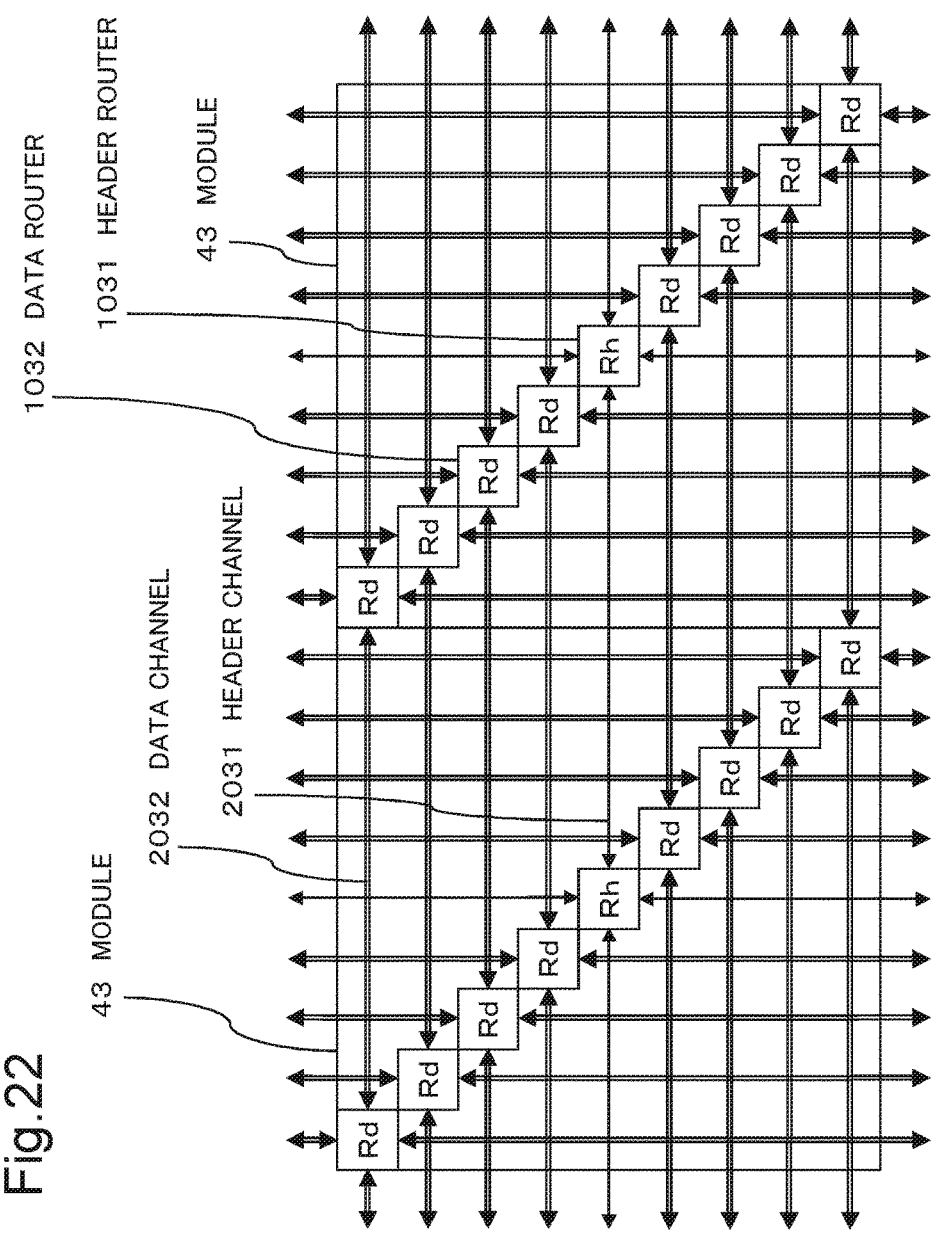
FIG. 22 is a block diagram illustrating an example of a configuration of a module in a third exemplary embodiment.

FIG. 22 is a block diagram illustrating an example of a configuration of a module 43 of the third exemplary embodiment. In FIG. 22, 'Rh' and 'Rd' indicate a header router and a data router respectively. As illustrated in FIG. 22, the module 43 includes a header router 1031 and a data router 1032. Configurations of the header router 1031 and the data router 1032 are the similar to the configuration of the router 101 illustrated in FIG. 7.

Figure 23:
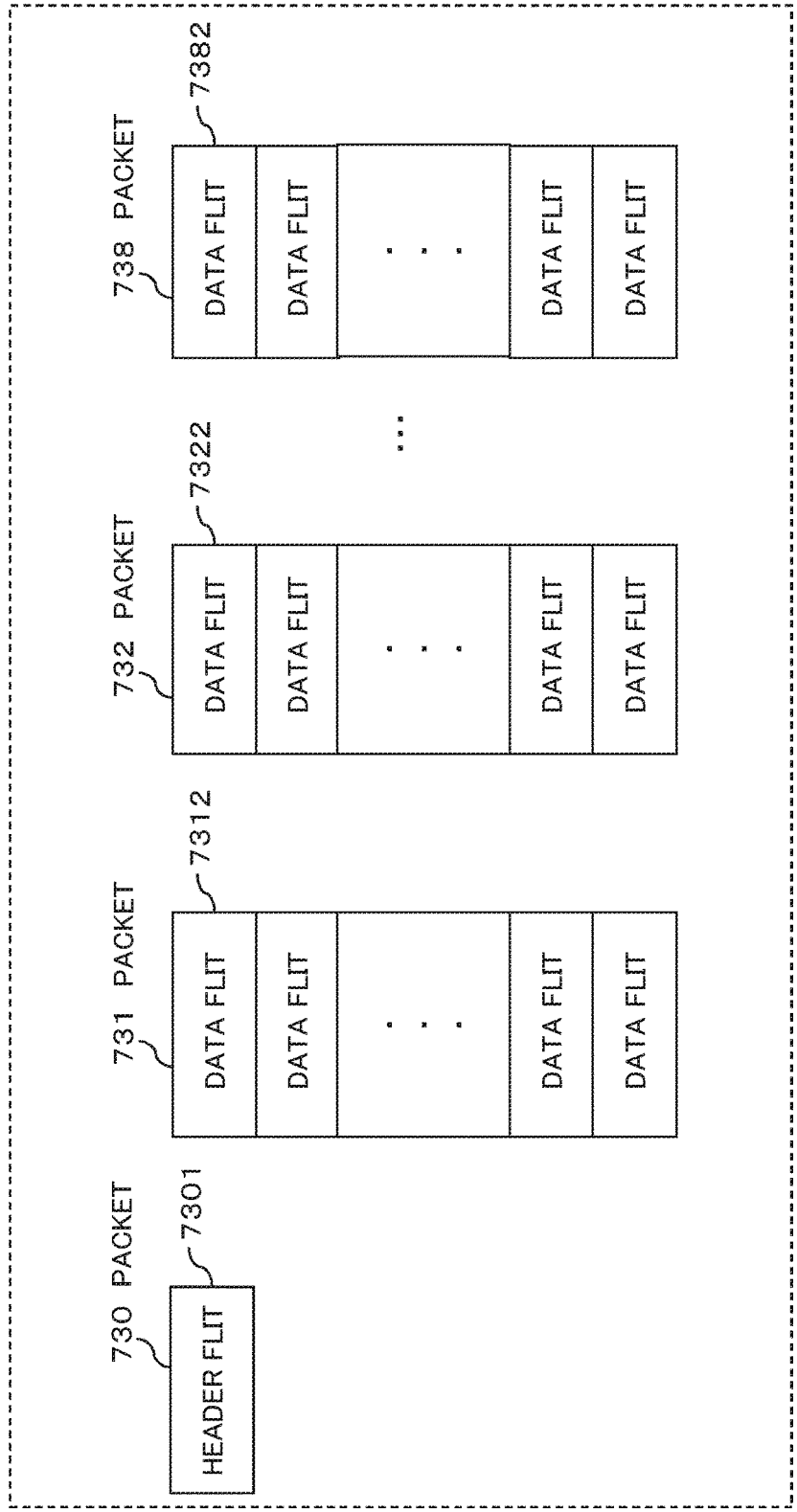
FIG. 23 is a diagram illustrating an example of structure of a packet in the third exemplary embodiment.

FIG. 23 is a diagram illustrating an example of structure of a packet 730 to 738. As illustrated in FIG. 23, the packet 730 includes a header flit 7301. For example, the header flit 7301 is corresponding to the header flit 710.

Similarly, the packets 731 to 738 include a data flit 7312 7382 respectively. Each of the data flit 7312 to 7382 correspond to 8 data flits into which the data flit 7002 illustrated in FIG. 5 is divided.

A header router 1031 (called first header router 1031) of one of the module 43 sends and receives the header flit 7301 between the other header router 1031 (called second header router 1031) of another module 43.

Each of first data routers 1032 send and receive the data flits 7312 to the data flit 7382 between and the each of second data routers 1032 respectively. In this case, the first data routers 1032 are included in a one of the module 43, and the second data routers 1032 are included in another module 43, each of which corresponds to the first data routers 1031.

The first header router 1031 and the second header router 1031 are connected with a header channel 2031 which includes a plurality of wires. The first data router 1032 and the second data router 1032 are connected with a data channel 2032 which includes a plurality of wires.

For example, the physical wires assigned to the header channel 2031 are physical wires arranged at the highest layer or the second layer from the top of the LSI chip. Moreover, the physical wires are assigned to the data channel 2032 are arranged at the third or the fourth layer of the LSI chip.

A transfer speed at the highest layer or the second layer is higher than a transfer speed at the third or the fourth layer. Accordingly, the header flit 7301 arrives at a transfer destination earlier than the data flit 7312 to 7382 arrive. Then, the header router 1031, which is the transfer destination, performs calculation with respect to routing control while the data flit 7312 to 7382 are transferred. The header router 1031 distributes the calculation result to each of the data routers 1032.

The module 43 according to the present exemplary embodiment can be applied the first to the fourth modifications of the first exemplary embodiment, or the second exemplary embodiment of the present invention.

In addition to the advantageous effect of the first exemplary embodiment, the fourth exemplary embodiment as described above has an advantageous effect in a point that it is possible to lower latency with respect to the data transfer between the modules 43.

The reason is that the physical wires assigned to the header router 1031 are arranged at the higher layer of the LSI chip 31 in comparison with the physical wires assigned to the data router 1032.

<<<Fourth Exemplary Embodiment>>>

Next, a fourth exemplary embodiment of the present invention will be explained in detail with reference to drawings. Hereinafter, explanation overlapping with the earlier description will be omitted within a range not to obscure the description of the second exemplary embodiment.

Figure 24:
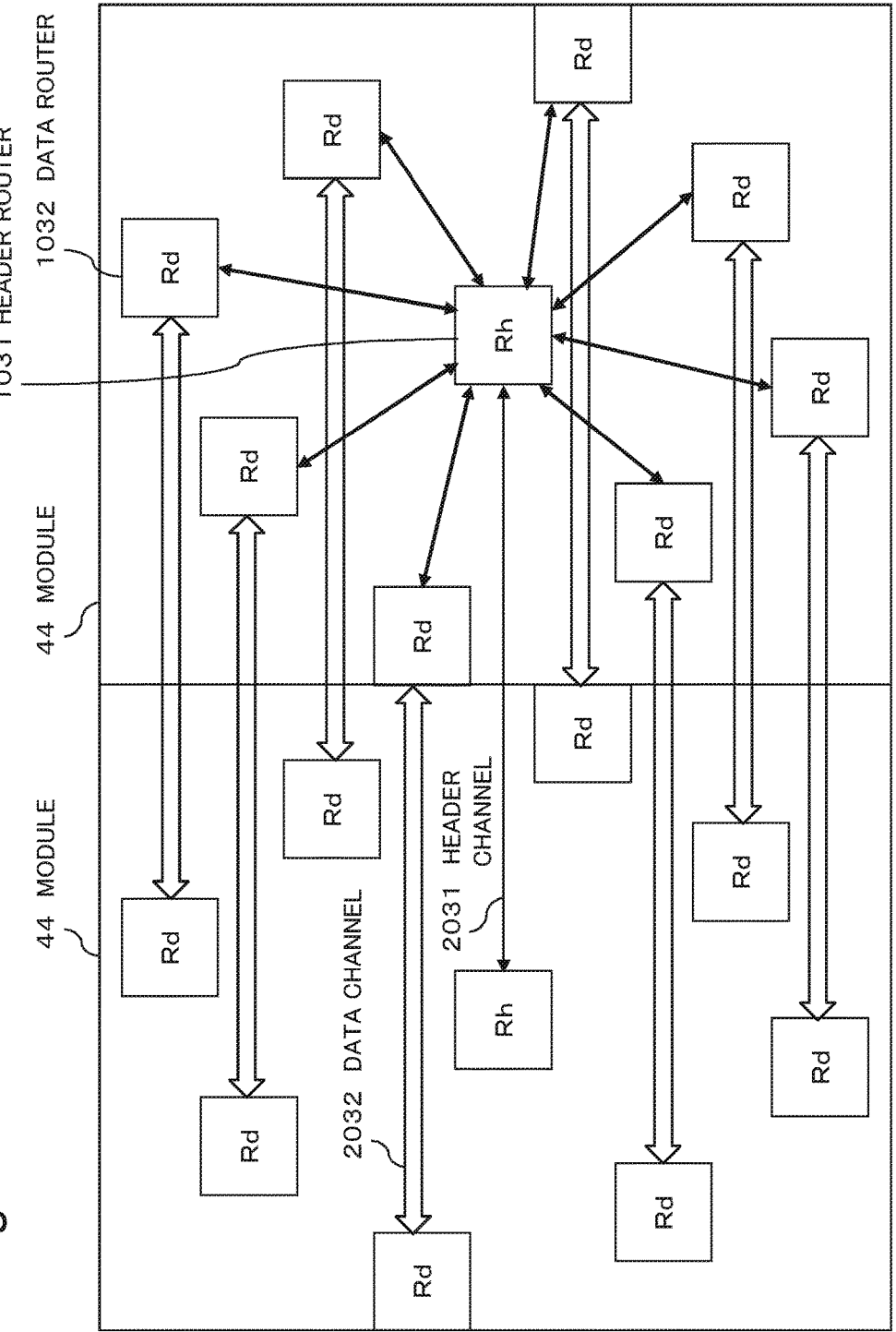
FIG. 24 is a block diagram illustrating an example of a configuration of a module in a fourth exemplary embodiment.

FIG. 24 is a block diagram illustrating an example of a configuration of a module 44 of the fourth exemplary embodiment. As illustrated in FIG. 24, the module 44 is different from the module 43 illustrated in FIG. 21 in the following points. Firstly, the header router 1031 is arranged at a center of the module 44. Secondly, the data routers 1032 are arranged on each side of rhombus like the module 42 illustrated in FIG. 19. It is noted that in FIG. 24, description other than the header channel 2031 and the data channel 2032 between the modules 44 are omitted. The module 44 according to the fourth exemplary embodiment can be applied to the first to the fourth modifications of the first exemplary embodiment. For example, in the case of applying the present exemplary embodiment to the fourth modification of the first exemplary embodiment, the module 44 may transfer the packets 721 to 72n having the structure illustrated in FIG. 18 in a single stage. In addition to the advantageous effect of the third exemplary embodiment, the module 44 according to the present exemplary embodiment mentioned above has an advantageous effect in a point that it is possible to lower latency with respect to a connection of a core (not illustrated in the drawing) of the module 44, and to improve throughput.

The reason is that the header router 1031, which transmits and receives the header flit 7301, is arranged at the almost central position of the module 44. While network on chip, which composes the two-dimensional blocking torus network, has been exemplified, each of the exemplary embodiments may be applied to any network on chip topology including the three-dimension topology. The LSI chip 31 explained in the above-described exemplary embodiments is provided in the following form.

Figure 25:
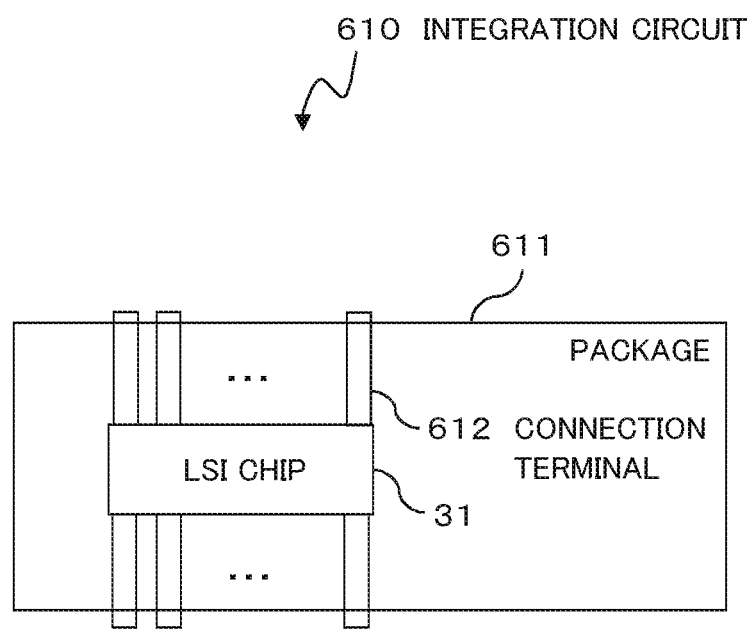
FIG. 25 is a block diagram illustrating an example of an integrated circuit which includes the LSI chip according to each of the exemplary embodiments.

FIG. 25 is a block diagram illustrating an example of an integrated circuit (also called a chipset) 610 which includes the LSI chip 31. As illustrated in FIG. 25, the integrated circuit 610 includes the LSI chip 31, a package 611 on which the LSI chip 31 is mounted, a connection terminal 612 connected to the LSI chip 31 and extends to the outside of the package 611.

Figure 26:
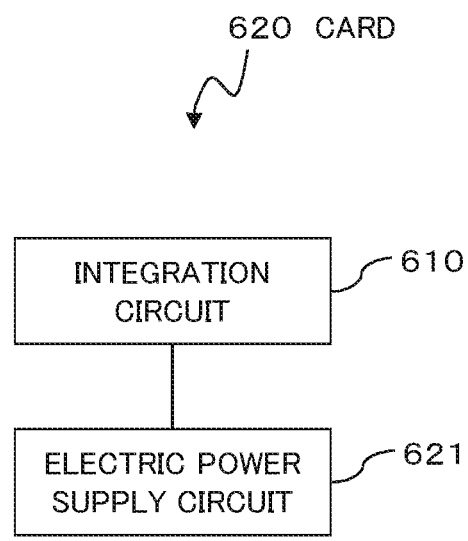
FIG. 26 is a block diagram illustrating an example of a card which includes the integrated circuit including the LSI chip according to each of the exemplary embodiments.

FIG. 26 is a block diagram illustrating an example of a card 620 which includes the integrated circuit 610. As illustrated in FIG. 26, the card 620 includes the integrated circuit 610, and an electric power supply circuit 621 which supplies electric power to the integrated circuit 610

Figure 27:
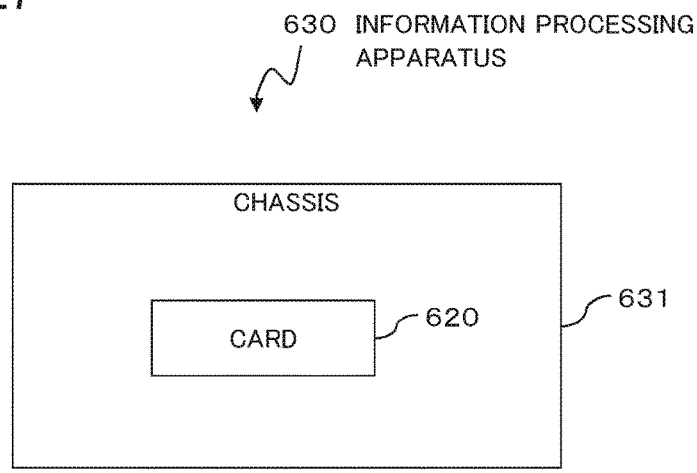
FIG. 27 is a block diagram illustrating g an example of an information processing apparatus which includes the card mounting the integrated circuit including the LSI chip according to each of the exemplary embodiments.

FIG. 27 is a block diagram illustrating an example of an information processing apparatus 630 which includes the card 620. As illustrated in FIG. 27, the information processing apparatus 630 includes the card 620 and a chassis 631 in which the card 620 is mounted.

Figure 28:
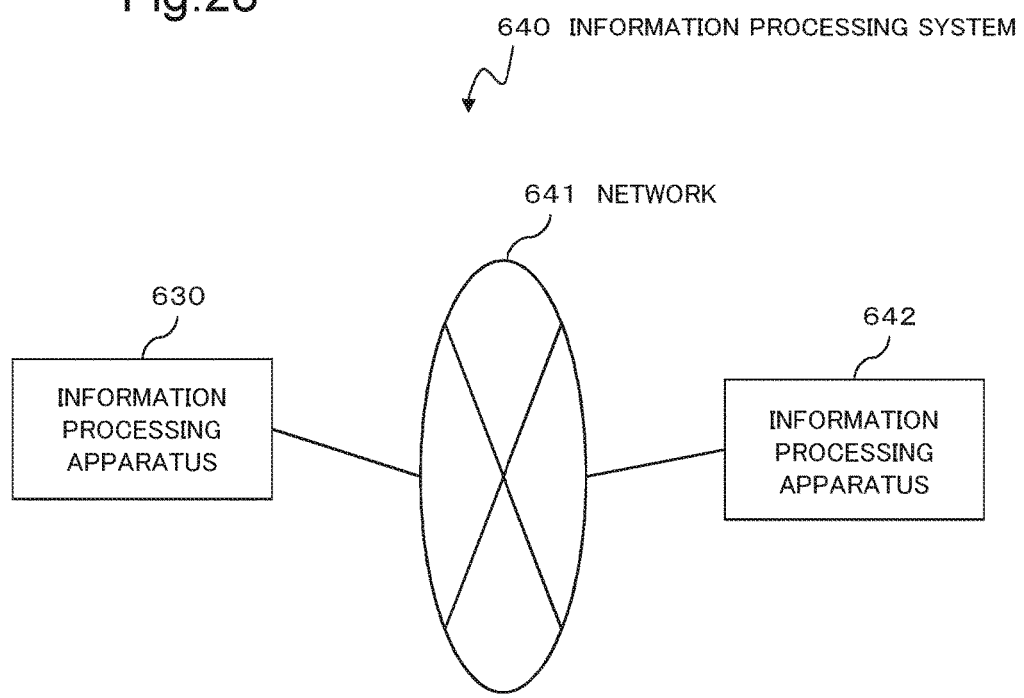
FIG. 28 is a block diagram illustrating an example of an information processing system which includes the information processing apparatus including the card mounting the integrated circuit including the LSI chip according to each of the exemplary embodiments.

FIG. 28 is a block diagram illustrating an information processing system 640 which includes the information processing apparatus 630. As illustrated in FIG. 28, the information processing system 640 includes the information processing apparatus 630 and an information processing apparatus 642 connected to the information processing apparatus 630 through a network 641. The network 641 may be any types of network. That is, a type of a network topology or a type of a network protocol for the network 641 are not limited. Moreover, the information processing apparatus 642 may be any kinds of information processing apparatus. In addition, the information processing system 640 may include a plurality of the information processing apparatus 630.

In the recent LSI design, Network on chip architecture, which connects modules in a LSI chip by use of routers and channels, is being adopted.

Reducing a size is one of important challenges in developing a semiconductor chip or an integrated circuit including the semiconductor chip. Especially, in the semiconductor chip adopting network on chip architecture, an area of the router which routes data transfer between the modules can be a burden for reducing the size of the module included in the semiconductor chip. Therefore, a technology to reduce an area occupied by the router is desired.

Meanwhile, a size of data transferred between the modules, is one of factors to determine the area occupied by the router. That is, the size of data transferred between the modules is determined by the number of wires which connects between the routers, and the number of the wires is one of the factors to determine the area occupied by the router. However, if the number of the wires is reduced in order to reduce the size of the area occupied by the routers, the size of data transferred between the modules are also reduced. Reducing the size of data transferred between the modules causes degradation of throughput.

PTL 1 does not disclose any technology related to the above-described task. According to PTL 2, the routing apparatus is split into the first level router which routes data on a plane of function module, and the second level router which routes data in a traversing direction on the plane of function module. According to PTL 2, by splitting the routers as described above, an area and power consumption of a crossbar switch of the router can be reduced in comparison with a case that the routing apparatus is not split.

However, the arts disclosed in the prior art has a problem that it is not sufficient to reduce the area occupied by the router under the condition of ensuring the predetermined latency during the data transfer in the semiconductor chip.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Furthermore, it is noted that the inventor's intent is to retain all equivalents of the claimed invention even if the claims are amended during prosecution.

The invention claimed is:

1. An integrated circuit, comprising:
   a plurality of modules each including a plurality of routers into which one router is divided, one module of the plurality of modules sending and receiving data with another module thereof via a plurality of first routers included in the one module and a plurality of second routers included in the other module, each of the plurality of first routers corresponding to each of the plurality of second routers, wherein
   a number of the plurality of the routers in each module of the plurality of modules is determined such that a minimum occupied area determined by a number of physical wires included in a channel is greater than or equal to a minimum occupied area determined by a hardware volume of the router.

2. The integrated circuit according to claim 1, wherein:
   the routers in the module are arranged in such a way that an area projecting from a side of the router does not overlap with that of another router, the side of the router being a side to which wiring is connected and being projected to the area along a direction of the wiring.

3. The integrated circuit according to claim 1, wherein:
   the routers are arranged in such a way that a distance between each of the plurality of routers in the module and a center of the module is more uniform as compared with a case that the routers are arranged on a diagonal line of the module.

4. The integrated circuit according to claim 1, wherein:
   the routers in the module are arranged in such a way that a maximum closed shape composed of straight lines drawn through centers of each of the plurality of routers is a substantially rhombus.

5. The integrated circuit according to claim 1, wherein:
   one of the plurality of routers is arranged at substantially a center of the module.

6. The integrated circuit according to claim 1, wherein:
   a physical wire connecting the first router and the second router is arranged on a highest layer and a layer adjacent to the highest layer.

7. The integrated circuit according to claim 1, wherein:
   a physical wire connecting the routers that send and receive information necessary for path control between the routers is arranged at a higher layer of the integrated circuit as compared to a physical wire between the routers through which information other than the information necessary for path control in the routers is sent and received.

8. A semiconductor device, comprising:
   the integrated circuit according to claim 1;
   a package that encapsulates the integrated circuit; and
   a connection terminal configured to connect to the integrated circuit and to extend outside of the package.

9. A card, comprising:
   the integrated circuit according to claim 1; and
   a circuit configured to supply electric power to the integrated circuit.

10. A data transfer method for a plurality of modules included in a semiconductor circuit, comprising:
    determining a plurality of first routers included in one of the modules and a plurality of second routers included in another module; and
    sending and receiving data with the other module via the plurality of first routers and the plurality of second routers, wherein
    a number of the plurality of routers in each module of the plurality of modules is determined such that a minimum occupied area determined by physical wires included in a channel is greater than or equal to a minimum occupied area determined by a hardware volume of the router.

11. The data transfer method according to claim 10, wherein:
one of the plurality of routers sends and receives information required for path control, and other routers of the plurality of routers send and receive information other than the information required for the path control.

* * * * *